(12) United States Patent
Punzalan et al.

(10) Patent No.: US 11,881,494 B2
(45) Date of Patent: Jan. 23, 2024

(54) SEMICONDUCTOR PACKAGE WITH DAMS

(71) Applicant: UTAC Headquarters Pte. Ltd., Singapore (SG)

(72) Inventors: Jeffrey Punzalan, Singapore (SG); Il Kwon Shim, Singapore (SG)

(73) Assignee: UTAC HEADQUARTERS PTE. LTD., Singapore (SG)

( * ) Notice: Subject to any disclaimer, the term of this patent is extended or adjusted under 35 U.S.C. 154(b) by 122 days.

(21) Appl. No.: 17/480,090

(22) Filed: Sep. 20, 2021

(65) Prior Publication Data

US 2022/0093482 A1  Mar. 24, 2022

Related U.S. Application Data

(60) Provisional application No. 63/086,039, filed on Sep. 30, 2020, provisional application No. 63/080,782, filed on Sep. 20, 2020.

(51) Int. Cl.
| | |
|---|---|
| *H01L 23/12* | (2006.01) |
| *H01L 27/146* | (2006.01) |
| *H01L 21/56* | (2006.01) |
| *H01L 23/31* | (2006.01) |
| *H01L 23/00* | (2006.01) |

(52) U.S. Cl.
CPC ........ *H01L 27/14618* (2013.01); *H01L 21/56* (2013.01); *H01L 23/3185* (2013.01); *H01L 24/32* (2013.01); *H01L 24/83* (2013.01); *H01L 27/14632* (2013.01); *H01L 27/14636* (2013.01); *H01L 27/14687* (2013.01); *H01L 24/48* (2013.01); *H01L 24/73* (2013.01); *H01L 2224/32225* (2013.01); *H01L 2224/48225* (2013.01); *H01L 2224/73265* (2013.01)

(58) Field of Classification Search
CPC ............... H01L 23/315; H01L 23/3185; H01L 27/14618; H01L 2224/73265
USPC .................................. 257/704, 784, 100, 432
See application file for complete search history.

(56) References Cited

U.S. PATENT DOCUMENTS

| | | | |
|---|---|---|---|
| 6,545,332 B2 * | 4/2003 | Huang | H01L 24/97 257/676 |
| 6,674,159 B1 * | 1/2004 | Peterson | H01L 27/14618 257/434 |
| 7,511,374 B2 * | 3/2009 | Derderian | H01L 27/14683 257/725 |
| 2001/0042915 A1 * | 11/2001 | Su | H01L 21/565 257/734 |
| 2006/0273249 A1 * | 12/2006 | Webster | H01L 27/14618 250/239 |
| 2007/0063135 A1 * | 3/2007 | Chen | H01L 23/057 250/239 |

(Continued)

FOREIGN PATENT DOCUMENTS

CN          211320101 U      8/2020

*Primary Examiner* — Nitin Parekh
(74) *Attorney, Agent, or Firm* — HORIZON IP PTE LTD.

(57) ABSTRACT

A semiconductor package and a method of manufacturing thereof is disclosed. The package includes a package substrate having a die attach region with a die attached thereto. A protective cover is disposed over a sensor region of the die and attached to the die by a cover adhesive. The package includes a dam structure configured to protect components of the semiconductor package from contamination.

20 Claims, 24 Drawing Sheets

(56) References Cited

U.S. PATENT DOCUMENTS

| | | | |
|---|---|---|---|
| 2009/0026593 A1* | 1/2009 | Kwang | H01L 24/48 257/676 |
| 2010/0038776 A1* | 2/2010 | Bessemoulin | H01L 23/4334 257/E23.181 |
| 2019/0157222 A1* | 5/2019 | Lakhera | H01L 23/315 |

* cited by examiner

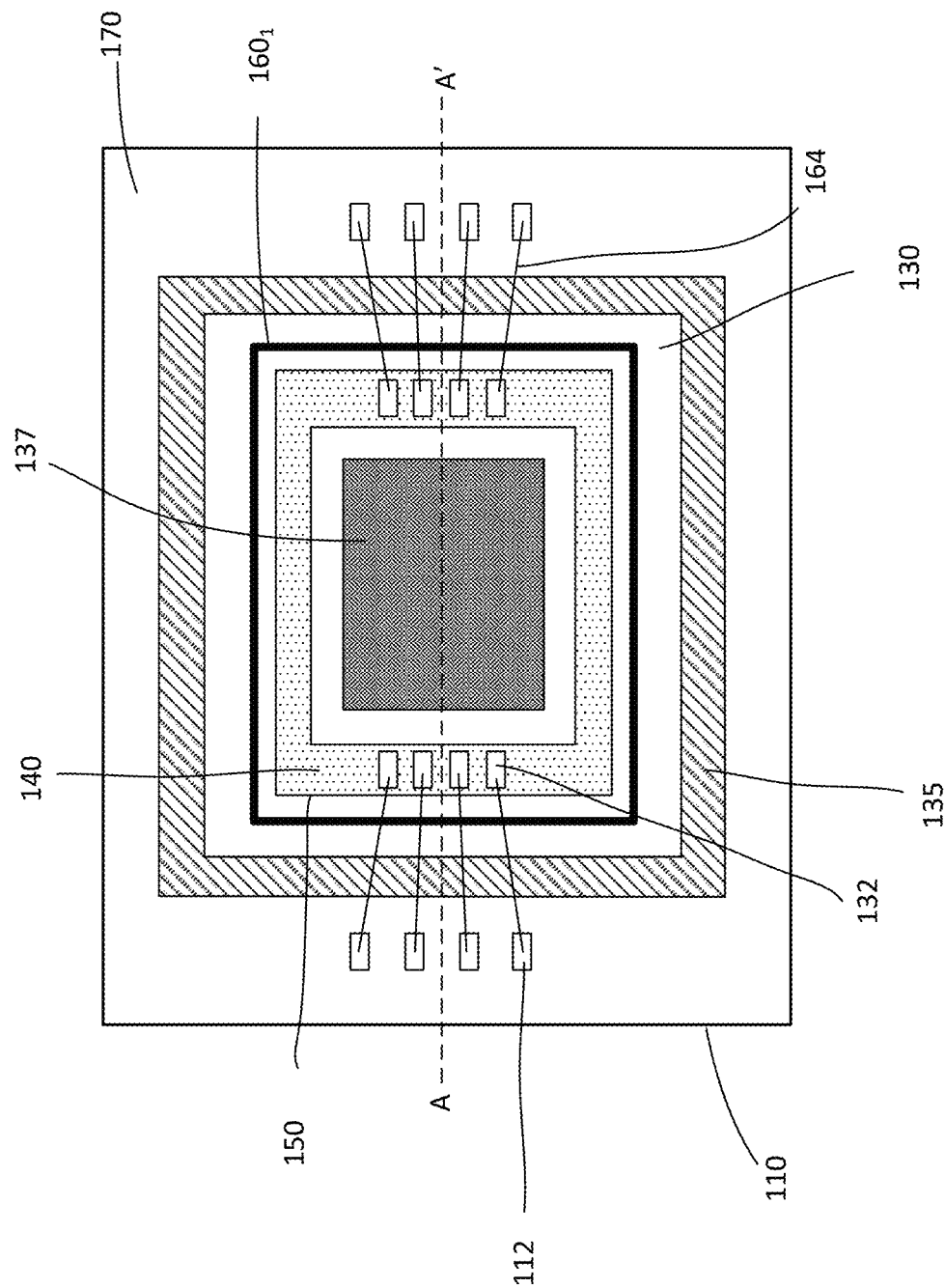

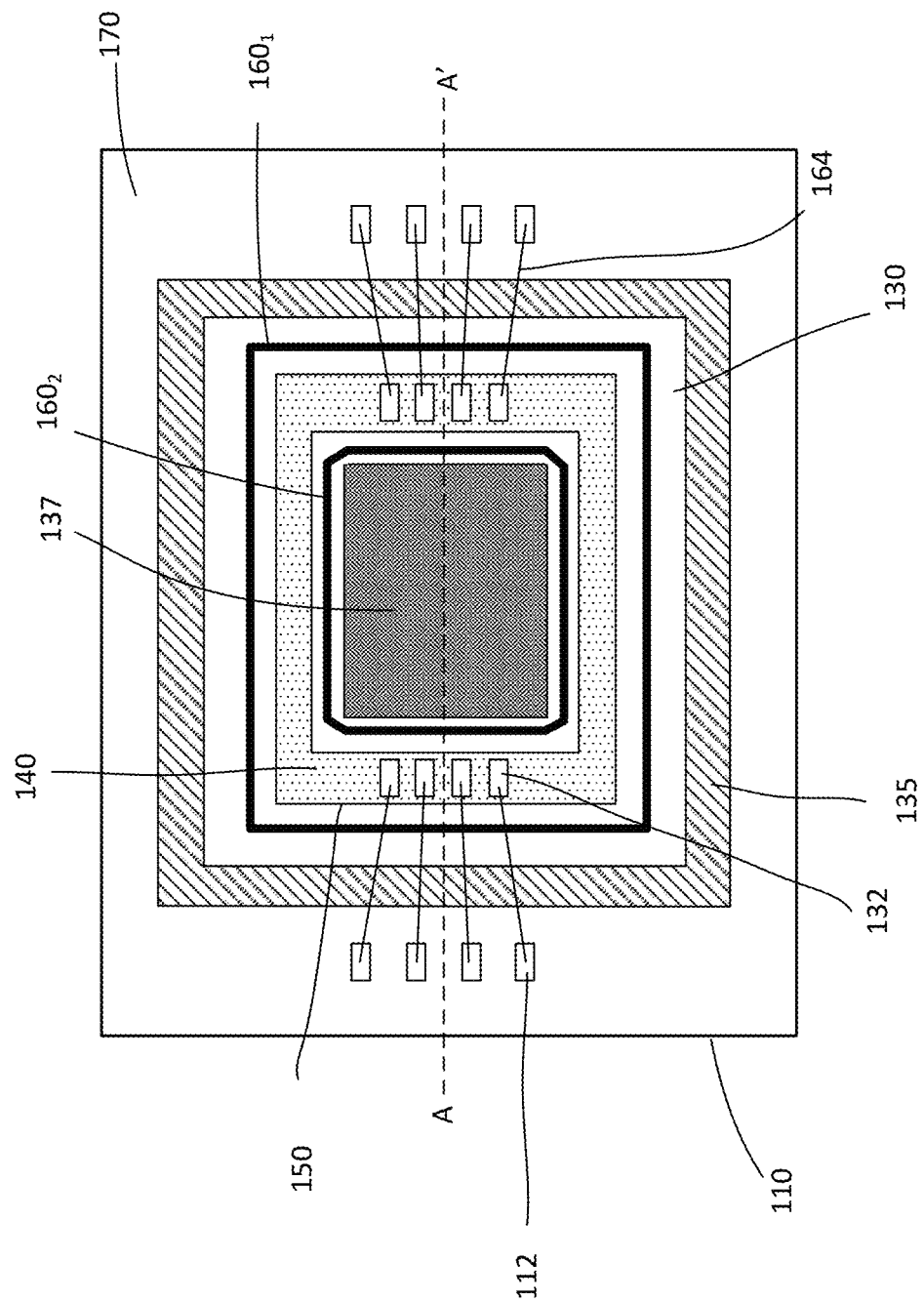

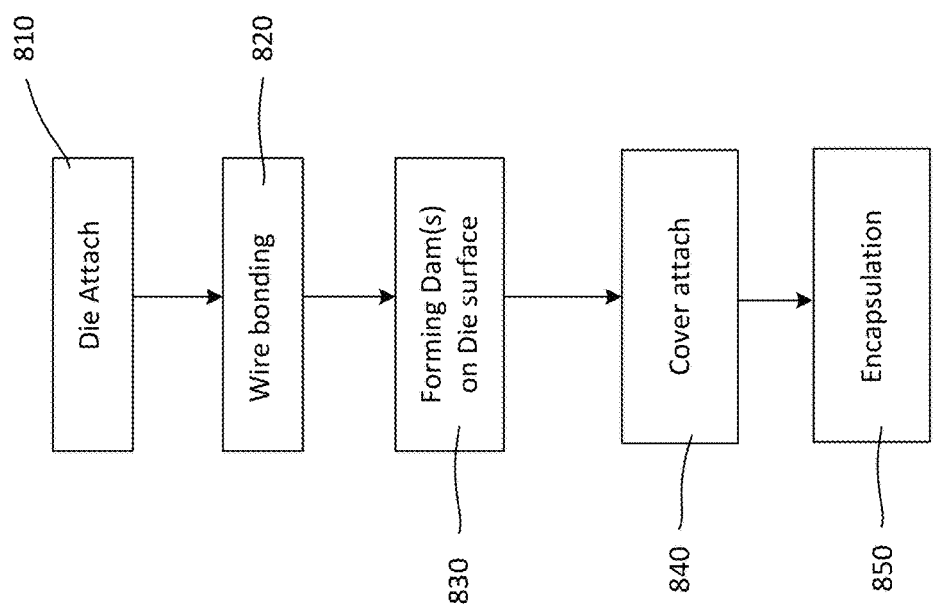

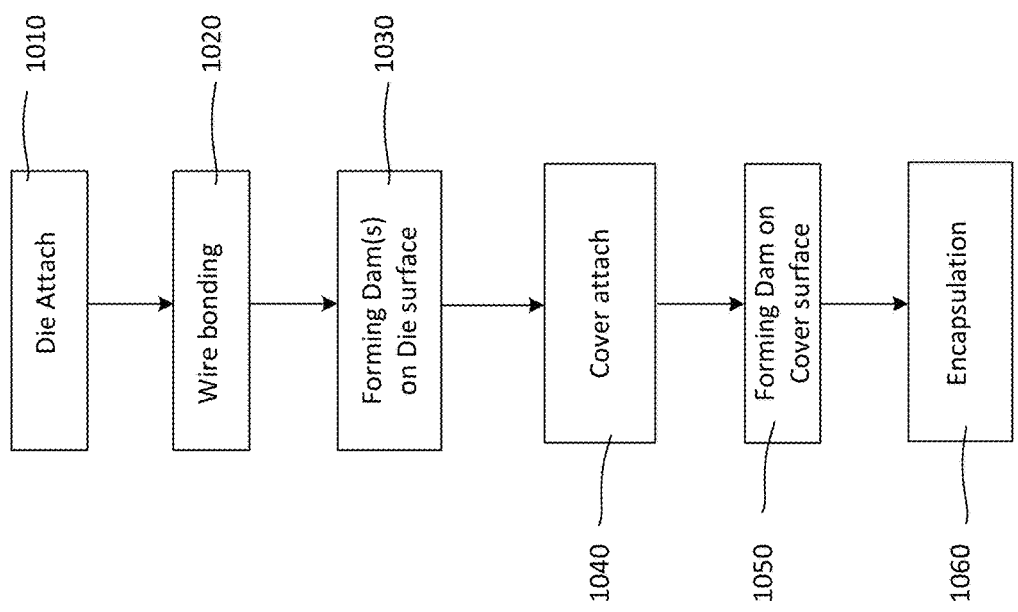

SEMICONDUCTOR PACKAGE WITH DAMS

CROSS-REFERENCE TO RELATED APPLICATION

This application claims the benefit of U.S. Provisional Application No. 63/080,782, filed on Sep. 20, 2020, and also claims the benefit of U.S. Provisional Application No. 63/086,039, filed on Sep. 30, 2020, which are incorporated herein by reference in their entirety for all purposes. This application cross-references to co-pending U.S. patent application Ser. No. 17/478,978, filed on Sep. 20, 2021, which claims the benefit of U.S. Provisional Application No. 63/080,782, filed on Sep. 20, 2020, and also claims the benefit of U.S. Provisional Application No. 63/086,039, filed on Sep. 30, 2020, the disclosure of which is herein incorporated by reference in their entireties for all purposes.

FIELD OF THE INVENTION

The present disclosure relates to semiconductor packages and the manufacturing method of such packages. In particular, the present disclosure relates to semiconductor packages for sensor chips. More specifically, the present disclosure relates to semiconductor packages for image sensor chips.

BACKGROUND

Sensing devices generally include sensor chips used for receiving non-electrical signals from the surrounding environment. A sensor chip converts the non-electrical signals received into electrical signals that are transmitted to a printed circuit board. For example, an image sensor chip converts incoming light into an electrical signal that can be viewed, analyzed, or stored. Image sensors may be used in electronic imaging devices of both analog and digital types, which include digital cameras, camera modules and medical imaging equipment. Most commonly used image sensors may include semiconductor charge-coupled devices (CCD) or active pixel sensors in complementary metal-oxide-semiconductor (CMOS) or N-type metal-oxide-semiconductor (NMOS, Live MOS) technologies.

Typically, a transparent cover is provided over the sensor area of the image sensor die. For example, an adhesive is employed to attach the cover to the die. However, the adhesive has a tendency to bleed to the active or sensor area, and/or even the non-active area of the package when the cover is attached. This not only increases the risk of optical failure, but also affects reliability of the package. Moreover, reliability of the package can be compromised when an encapsulant bleeds over the exposed top surface of the cover during encapsulation.

Therefore, from the ongoing discussion, there is a desire to improve the package reliability and performance by preventing contaminations on undesired areas of the package during packaging.

SUMMARY

Embodiments generally relate to semiconductor packages and methods for forming semiconductor packages.

In one embodiment, a device includes a package substrate having top and bottom major package substrate surfaces and the top major package surface includes a die attach region. The device further includes a die having a second major die surface attached to the die attach region and a first major die surface of the die includes a sensor region and a die adhesive region surrounding the sensor region. A cover adhesive is disposed on the die adhesive region and a protective cover is attached to the die by the cover adhesive. The protective cover forms a cavity over the sensor region. The device also includes a dam structure which protects components of the device by preventing contaminants from bleeding beyond the dam structure.

In another embodiment, a method for forming a semiconductor package includes providing a package substrate having top and bottom major package substrate surfaces and the top major package surface includes a die attach region. The method also includes attaching a second major die surface of a die onto the die attach region and a first major die surface of the die includes a sensor region. The sensor region is sealed by a protective cover disposed thereover. The method further includes forming a dam structure on the package substrate and the dam structure protects components of the package by preventing contaminants from bleeding beyond the dam structure.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIGS. 1a to 1c show top and side cross-sectional views of various embodiments of a semiconductor package;

FIGS. 3a to 3c show top and side cross-sectional views of various embodiments of another semiconductor package;

FIG. 8 shows an exemplary process of forming an embodiment of a semiconductor package;

FIG. 10 shows an exemplary process of forming another embodiment of a semiconductor package.

DETAILED DESCRIPTION

Embodiments described herein generally relate to semiconductor packages and methods for forming a semiconductor package. In some embodiments, the semiconductor package includes a sensor chip used for sensing environmental signals, such as optical signals, audio signals, or the like. The semiconductor package includes a cover over the sensor chip. The semiconductor package may include other types of chips with a cover thereover. The semiconductor package may be incorporated into electronic devices or equipment, such as sensing devices, navigation devices, telecommunication devices, computers and smart devices.

Figure 1B:
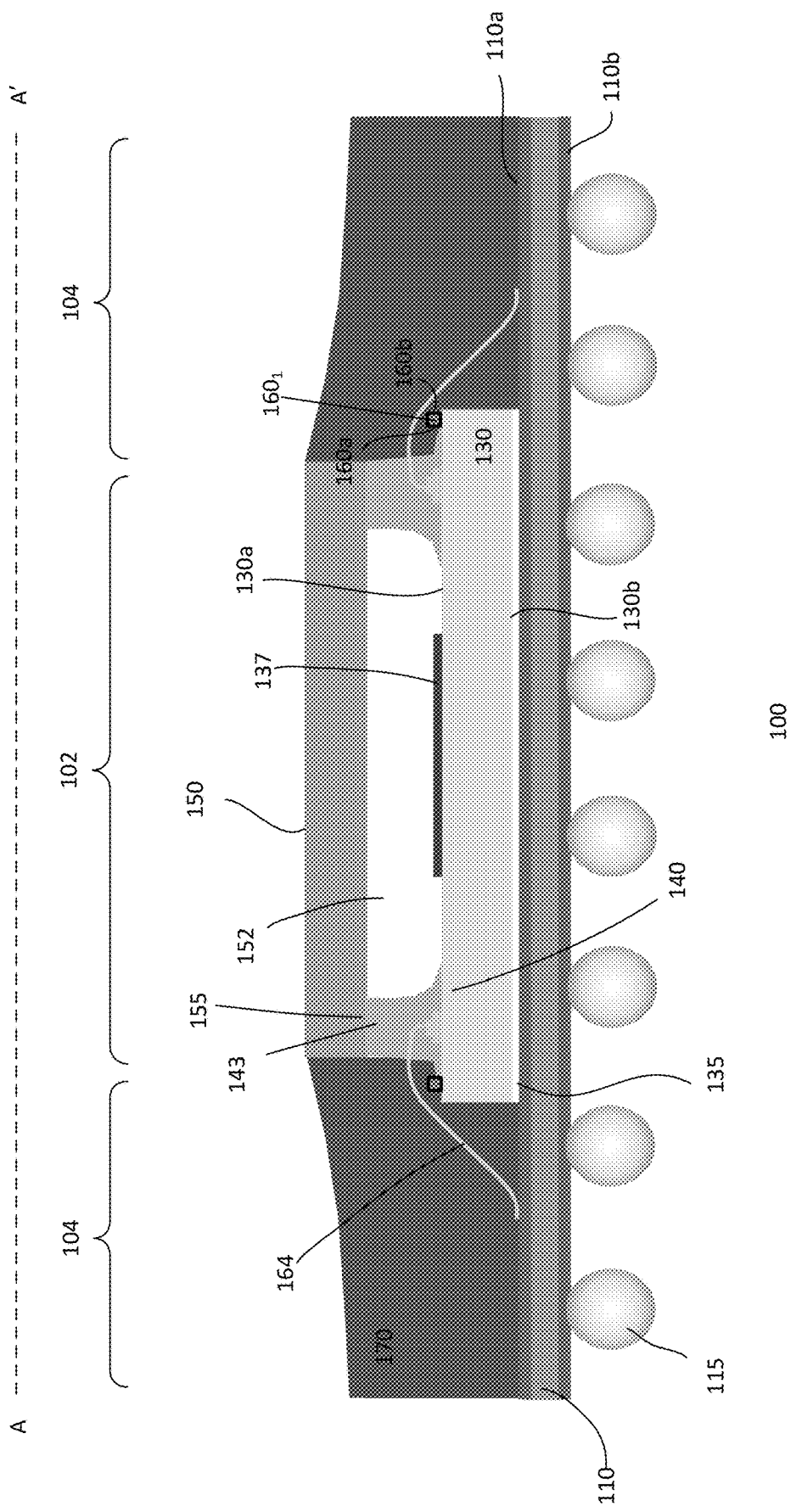
Figure 1C:
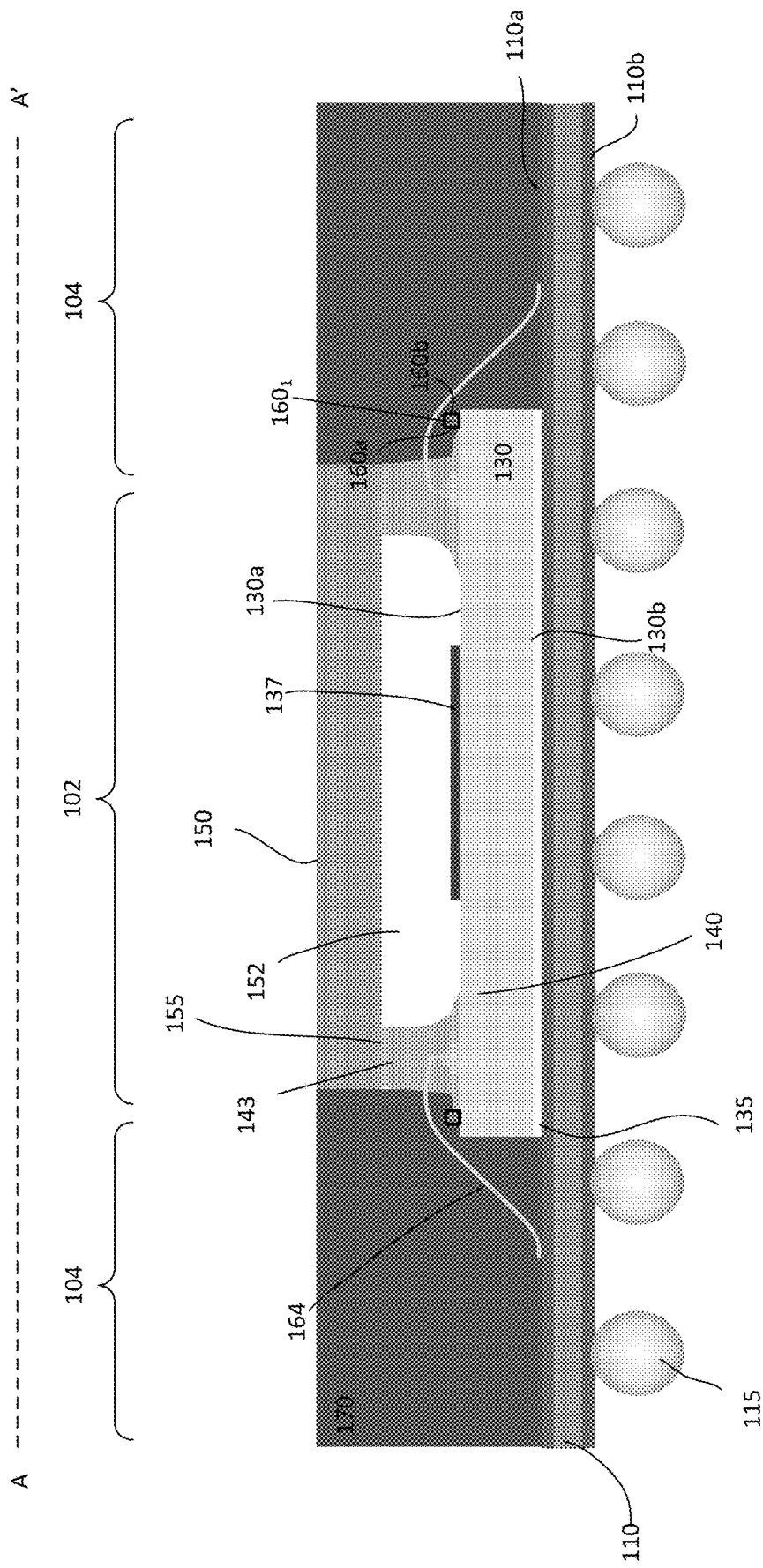

FIGS. 1a to 1c show top and side cross-sectional views of various embodiments of a semiconductor package 100. In particular, FIG. 1a shows a top cross-sectional view of a semiconductor package 100 with a protective cover, and FIGS. 1b to 1c show cross-sectional views taken along the A-A of the semiconductor package 100 packaged in different encapsulants. The various embodiments include common elements. Common elements may not be described or described in detail.

The semiconductor package 100 includes a package substrate 110 having opposing first and second major surfaces 110a and 110b. The first major surface 110a may be referred to as the top or active package surface and the second major surface 110b may be referred to as the bottom package surface. Other designations for the surfaces may also be useful.

The package substrate may be a multi-layer substrate. For example, the package substrate includes a stack of electrically insulating substrate layers. The different layers of the package substrate 110 may be laminated or built-up. In one embodiment, the package substrate 110 is a laminate-based substrate including a core or intermediate layer sandwiched between top and bottom substrate layers. Other types of substrate, including ceramic and lead frame substrates, may also be useful. It is understood that the package substrate 110 may have various configurations, depending on design requirements.

The top package surface of the package substrate may be defined with die and non-die regions 102 and 104. The non-die region 104, for example, surrounds the die region 102. For example, the die region may be centrally disposed within the top package surface of the package substrate with the non-die region surrounding it. Providing a die region which is not centrally disposed within the top package surface may also be useful. The die region includes a die attach region for a die to be mounted thereto.

The top package surface of the package substrate may include package bond pads. In some embodiments, the top package surface of the package substrate includes package bond pads 112 disposed in the non-die region 104. For example, the package bond pads are disposed outside of the die attach region. The bottom package surface may include package contacts 115. The package contacts, for example, are spherical-shaped structures or balls protruding from the bottom package surface. Other types of package contacts may also be possible. The package contacts may be formed of a conductive material such as a solder material. Various types of solder can be used to form the package contacts. For example, the solder can be a lead-based or non lead-based solder. Other suitable types of conductive materials may also be used to form the package contacts. The package contacts are configured to electrically couple to the package bond pads on the top package surface of the package substrate. For example, each package contact is coupled to its respective package bond pad. The package substrate may include one or more conductive layers embedded therein. The conductive layers may form interconnect structures including conductive traces and contacts for interconnecting the package contacts to package bond pads.

A die 130 is attached to the die attach region of the top package surface of the package substrate. The die, for example, includes first and second opposing major die surfaces 130a and 130b. The first major die surface may be referred to as a top or active die surface and the second major die surface may be referred to as a bottom or inactive die surface.

The die 130, as shown, is attached to the die attach region of the package substrate by a die adhesive 135. The adhesive may be a curable glue or adhesive tape. For example, a curing process may be performed to permanently attach the die to the die region. Other types of die adhesives may also be useful to attach the die to the die region. The bottom die surface 130b of the die, for example, contacts the die attach region. For example, the inactive die surface contacts the die attach region of the package substrate.

In one embodiment, the active die surface 130a includes a sensor region 137. For example, the die is a sensor chip. Other types of dies may also be useful. For example, the die may be a thermal or infrared (IR) image sensor chip. Other types of chips, for example, non-sensor chips, may also be useful. In the case of an image sensor chip, the sensor region may include a photosensitive sensor that may capture image information in response to light. The image sensor may be, for example, a CMOS or CCD type image sensor. In one embodiment, the sensor region includes an array of sensors. For example, each sensor may correspond to a pixel of an image. The sensor chip may include CMOS components embedded in the chip for controlling the sensor chip. Other configurations of the sensor chips may also be useful.

The active die surface 130a may include die bond pads 132 disposed outside of the sensor region. For example, the die bond pads may be disposed on the non-sensor region of the active surface of the die. The die bond pads are exposed by openings formed in a top passivation layer of the die. The surfaces of the die bond pads, for example, are substantially coplanar with the active surface of the die. Providing die bond pads with surfaces which are not coplanar with the active die surface may also be useful. The die bond pads provide external electrical connections to various components of the die. A conductive material, such as copper (Cu), aluminum (Al), Gold (Au), Silver (Ag), Nickel (Ni), solder material, or the alloys of these materials, or a combination thereof, may be used to form the die bonds pads. Other types of conductive material may also be useful. As shown, the die bond pads may be arranged into one or more rows disposed on the active surface of the die. Other arrangements of the die bond pads may also be useful.

In one embodiment, a plurality of wire bonds 164 is provided to electrically connect the die bond pads 132 on the active surface of the die to the package bond pads 112 on the top package surface of the package substrate. The wire bonds enable external connection to the internal circuitry of the die. The wire bonds, for example, may be formed of any suitable metal material such as, but not limited to, Cu, Au, Ag, Al, or the alloys of these materials, or a combination thereof. Other types of conductive materials may also be used. The wire bonds 164 create electrical connection between the interconnect structures (e.g., bond pads, conductive traces, via contacts, terminal pads) of the package substrate 110 and the semiconductor die 130.

A protective cover or cap 150 is disposed on the active surface of the die 130 over the sensor region 137. The protective cover includes first or top and second or bottom opposing cover surfaces with sides or edges. The bottom cover surface, for example, is facing the die. The protective cover, for example, may be a glass cover which enables light to penetrate to the sensor region. Other types of protective covers may also be useful. For example, the protective cover may depend on the type of sensor. The protective cover is larger than the sensor region, enabling it to be disposed thereover and to form a hermetically sealed cavity 152 to protect the sensor region from the external environment. For example, the protective cover serves as a cap over the sensor region. As shown, the protective cover has a rectangular shape. Providing a protective cover with other shapes may also be useful.

In one embodiment, the active die surface includes a die adhesive region 140. The die adhesive region 140, as shown, surrounds the sensor region 137. A cover adhesive 143 is disposed on the die adhesive region. The second or bottom surface of the protective cover includes a cap adhesive region 155. The cap adhesive region is the region of the protective cover which the cover adhesive contacts. For example, the cap adhesive region on the bottom surface of the protective cover and the die adhesive region on the active surface of the die are corresponding regions. In one embodiment, the cap adhesive region is disposed at a periphery of the bottom surface of the protective cover. The cap adhesive region extends inward from the edges of the protective cover. For example, when the protective cover is attached to the cover adhesive, side edges of the cover adhesive are aligned with the side edges of the protective cover. This advantageously provides for a package design with a smaller footprint. The cover adhesive may be formed of a curable adhesive. In one embodiment, the curable adhesive has a high transparency and high refractive index. For example, such curable adhesives include epoxy, acrylic, polyimide, urethane, thiol, or a combination thereof. Other suitable adhesive materials may also be useful, depending on the desired refractive index of the protective cover. A curing process may be performed to permanently attach the protective cover to the die.

When attached, the protective cover forms the cavity 152 over the sensor region. For example, the protective cover seals the sensor region. The protective cover, together with the cover adhesive, prevents contaminants, such as encapsulation material, from affecting the sensor region. The cavity may be a hermetically sealed cavity. Other types of cavity such as an air cavity may also be possible. In one embodiment, the cavity is configured with a desired cavity height. The desired cavity height is maintained by a predetermined height of the cover adhesive between the sensor region and the protective cover. The predetermined height, for example, should be sufficient to ensure that the protective cover does not contact either the wire bonds or the sensor region during the packaging process. For example, the predetermined height may be about less than 100 microns. In one embodiment, depending on the configuration of the die, the predetermined height may be different. For example, a predetermined height is set based on dimensions of an active die area. The predetermined height may also be determined based on a wire loop height of the wire bonds formed on the die. For example, for a die with a low wire loop design (low wire loop height), the predetermined height is about 50 to 60 microns. Other predetermined heights for the cover adhesive may also be useful.

As shown, the die bond pads 132 are disposed on the die adhesive region 140 with the cover adhesive. As such, portions of the wire bonds are covered by the protective cover. For example, when the cover adhesive 143 is applied on the die adhesive region 140, the cover adhesive covers the die bond pads 132 and portions of the wire bonds 164. This stabilizes the wire bonds and minimizes occurrence of wire sweep. Further, such configuration advantageously reduces the footprint of the package. Providing other configurations of die bond pads and wire bonds may also be useful. For example, the die bond pads may be disposed outside of the die adhesive region or a combination of die adhesive region and outside of the die adhesive region.

An encapsulant 170 is disposed on the package substrate. The encapsulant 170 covers the package substrate, exposed portions of the die and sides of the protective cover 150. For example, the encapsulant is configured to adhere to the sides of the protective cover while leaving the top of the protective cover exposed. For example, the encapsulant 170 extends into the non-die region 104 of the semiconductor package 100 to cover the exposed top surface of the package bond pads in the top package surface 110a. The encapsulant may be formed using ceramic, plastic, epoxy, or a combination thereof. Providing other materials to form the encapsulant may also be useful.

In one embodiment, as shown in FIG. 1b, the topmost surface of the encapsulant 170 may be formed slightly below the top surface of the protective cover 150 and slopes downwardly from the protective cover towards a perimeter of the non-die region 104. For example, a liquid encapsulant is used. Alternatively, as shown in FIG. 1c, the encapsulant 170 may be formed with vertical sidewalls and a substantially planar top surface that is about level with the top surface of the protective cover 150. For example, the encapsulant is a solid mold compound. The encapsulant provides a rigid and mechanically strong structure to protect the sensor region from the environment. For example, the encapsulant protects the sensor region from moisture and provides the protective cover with mechanical support.

With the demand for compact packages, the gaps between different components of the package become smaller and smaller. For example, the gap between the die adhesive region and the sensor region, the gap between the die adhesive region and the edges of the die and the gap between the edges of the protective cover and the sensor region are designed to be as small as possible to produce the smallest possible package footprint. The smaller gap sizes between the components can cause 1) the cover adhesive used to bond the protective cover to the die to form the sealed cavity to bleed into undesired areas, such as onto the sensor region of the die and/or onto the edges of the die or protective cover, and/or 2) the encapsulant to overflow onto the protective cover and hindering the transmission of lightwaves to the sensor region of the die and/or bleeding onto the die bond pads. This can cause package defects or affect the package reliability.

To improve package reliability, the package, in one embodiment, includes a dam structure. In one embodiment, the dam structure includes a die dam 1601. The die dam is an elevated ring-shaped structure disposed on the active surface of the die. The die dam is disposed in a non-sensor region of the active surface of the die. The ring-shaped structure may be a rectangular ring-shaped structure. Other ring-shaped structures may also be useful. The die dam has a height which prevents the cover adhesive and/or encapsulant from bleeding beyond the die dam. The height of the die dam may be about less than 100 microns. Other heights for the die dam which prevent bleeding of the adhesive or encapsulant therethrough may also be useful.

In one embodiment, the die dam has a rectangular-shaped cross-sectional profile. Other cross-sectional shaped die dams may also be useful. The die dam has opposing top and bottom surfaces and opposing first and second side surfaces 160a-b. The bottom surface of the die dam is disposed on the active die surface, the first or internal (inner) side surface 160a faces the die adhesive region and the sensor region, and the second or external (outer) side surface 160b faces the edges of the die. The side surfaces have a height which prevents the cover adhesive and/or the encapsulant from bleeding beyond the die dam, such as less than 100 microns.

In one embodiment, the die dam is disposed between the die adhesive region 140 and the edges of the die. For example, the die dam is a rectangular ring-shaped die dam surrounding the non-sensor region between the die adhesive region and edges of the die. The die dam, in this case, prevents the cover adhesive and encapsulant from bleeding beyond the die dam. For example, the cover adhesive is prevented from bleeding beyond the die dam towards the edges of the die and encapsulant from bleeding beyond the die dam towards the die bond pads and the sensor region. Providing other configurations of the die dam may also be possible. For example, the die dam may be disposed on other locations of the active die surface outside of the sensor region. The location or configuration of the die dam may be determined based on its application. In some embodiments, multiple die dams may be provided.

In one embodiment, the die dam is an adhesive-based dam. For example, the die dam may be formed from a liquid-based adhesive, or an adhesive film or tape. The adhesive is a non-conductive adhesive material. The adhesive may be a curable adhesive such as epoxy or any other suitable adhesive materials. For example, a liquid-based adhesive may be applied on the active die surface by a printing process, such as stencil printing. Other printing techniques using ink jet or ink dot may also be useful. Alternatively, other techniques including dispensing may also be possible. A curing process may be performed thereafter to form the die dam.

Figure 2A:
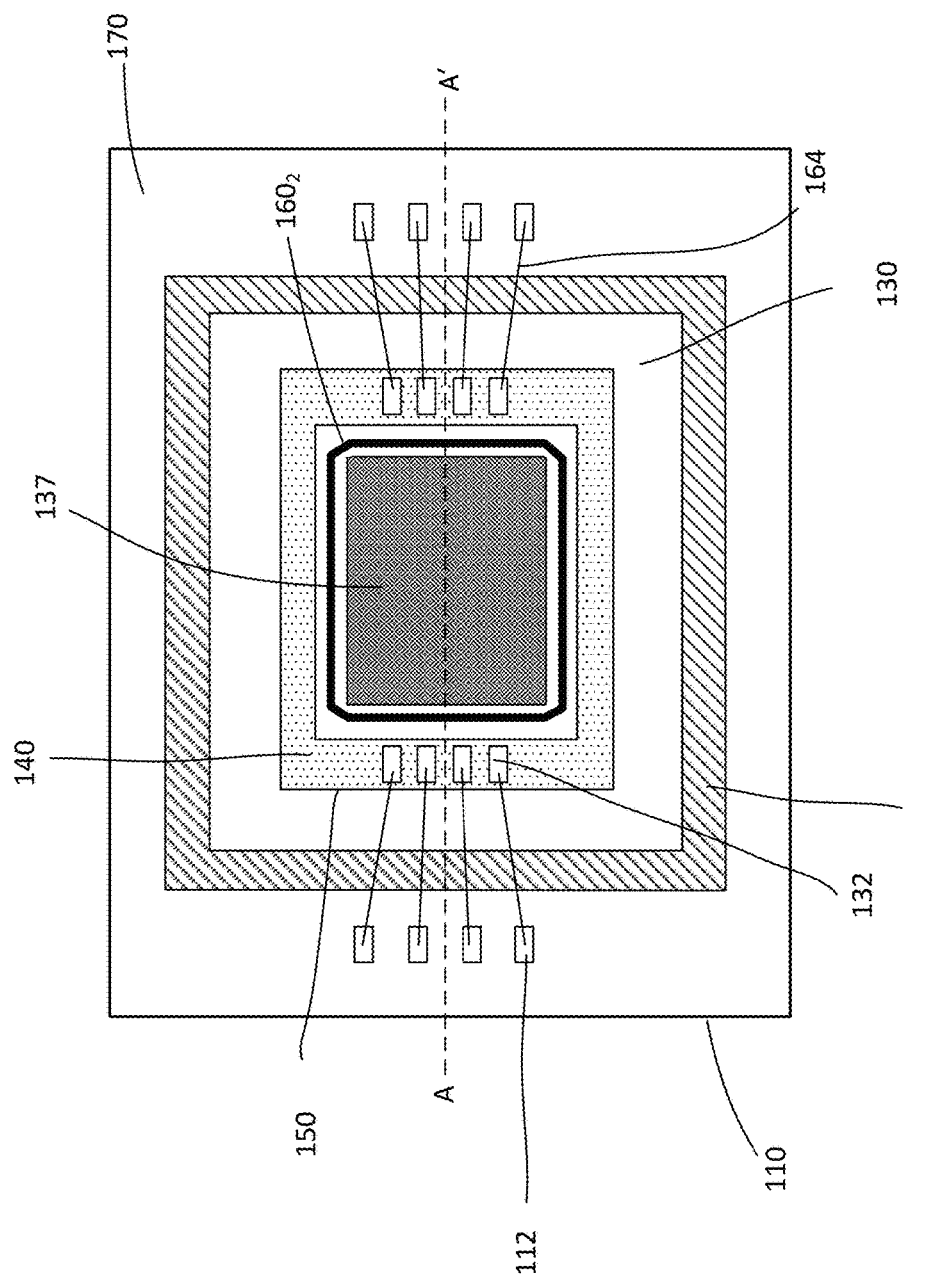
FIGS. 2a to 2c show top and side cross-sectional views of various embodiments of another semiconductor package.
Figure 2B:
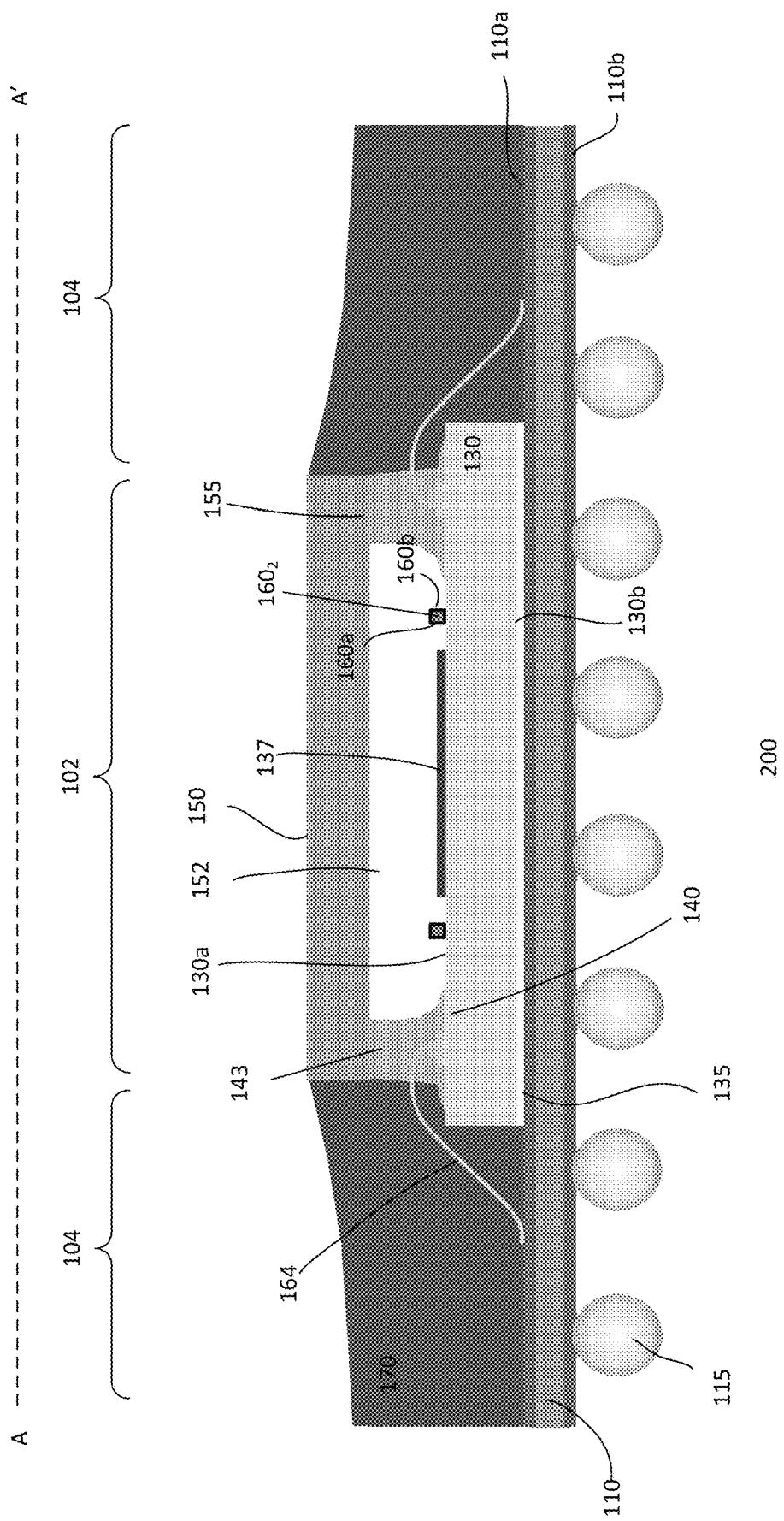
Figure 2C:
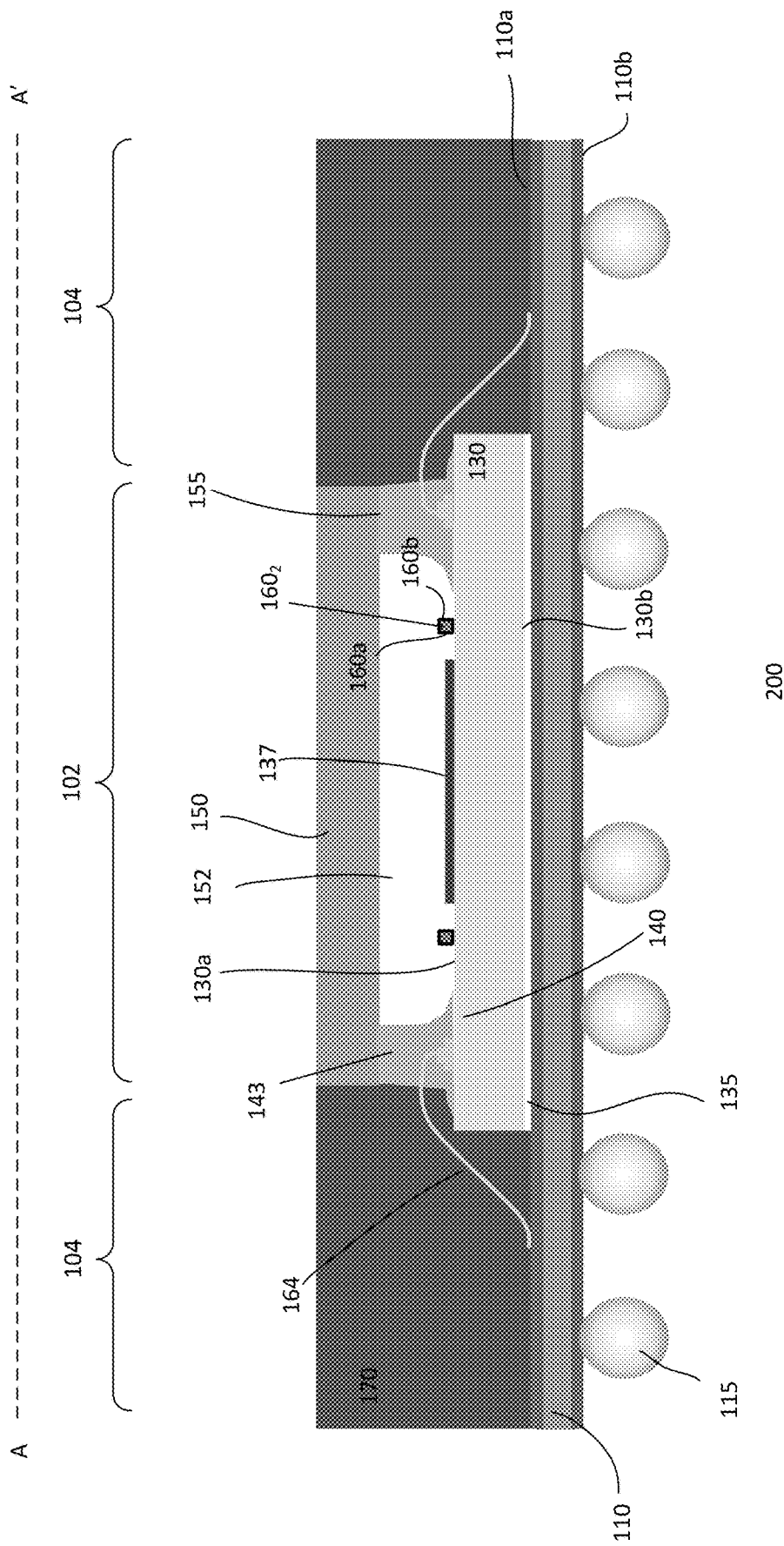

FIGS. 2a to 2c show top and side cross-sectional views of various other embodiments of a semiconductor package 200. In particular, FIG. 2a shows a top cross-sectional view of a semiconductor package 200 with the package cover, and FIGS. 2b to 2c show side cross-sectional views taken along the A-A of the semiconductor package 200 formed with different encapsulants. The semiconductor package of FIGS. 2a to 2c is similar to those shown in FIGS. 1a to 1c. Common elements may not be described or described in detail.

However, unlike FIGS. 1a to 1c, the die dam 1602 is surrounded by the die adhesive region 140 instead. The die dam, for example, is disposed between the die adhesive region with the cover adhesive 143 and the sensor region 137. For example, the die adhesive region surrounds the die dam which surrounds the sensor region. The die dam prevents the cover adhesive and encapsulant from bleeding beyond the die dam. For example, the cover adhesive and encapsulant are prevented from bleeding beyond the die dam towards the sensor region. As shown, the external side surface 160b of the die dam faces the die adhesive region 140 while the internal side surface 160a faces the sensor region 137. For example, the side surfaces have a height which prevents the cover adhesive and the encapsulant from bleeding beyond the die dam. As shown, the die dam has a rectangular-shaped cross-sectional profile with 4 slanted corners. Other configurations or shapes for the die dam may also be useful.

Figure 3B:
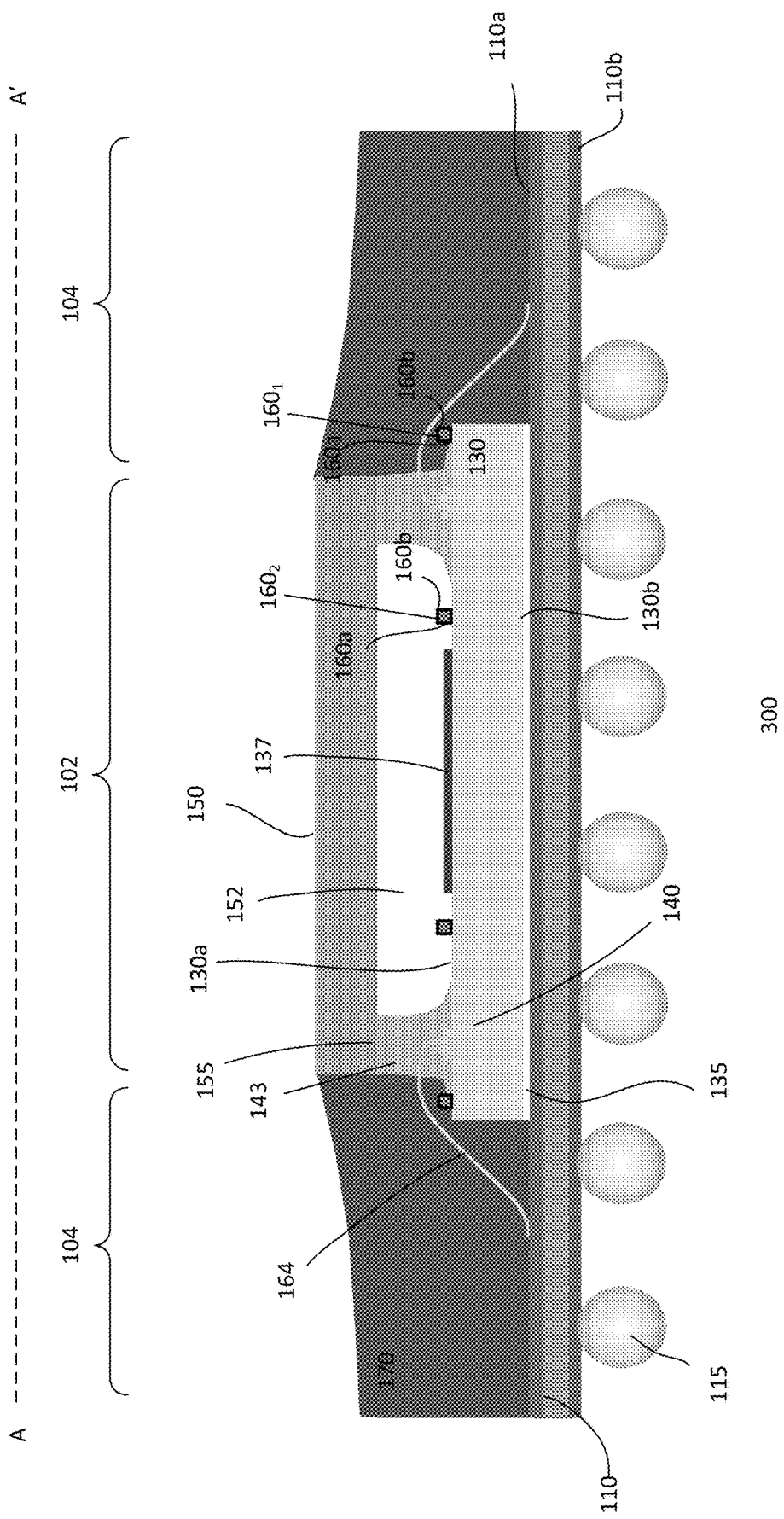
Figure 3C:
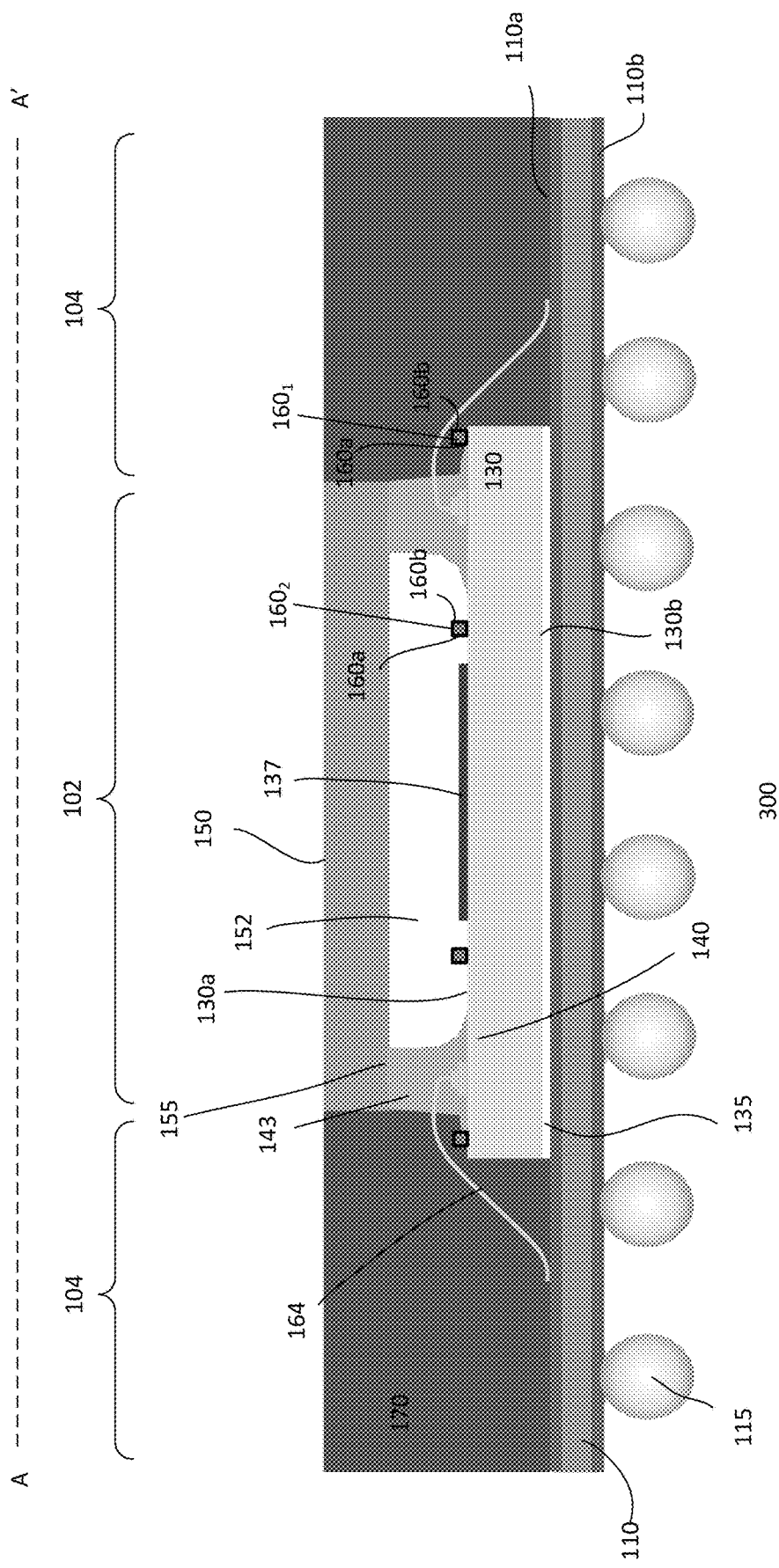

FIGS. 3a to 3c show top and side cross-sectional views of various embodiments of a semiconductor package 300. In particular, FIG. 3a shows a top cross-sectional view of a semiconductor package 300 with the package cover, and FIGS. 3b to 3c show side cross-sectional views taken along the A-A of the semiconductor package 300 formed with different encapsulants. The semiconductor package is similar to those described in FIGS. 1a to 1c and FIGS. 2a to 2c. Common elements may not be described or described in detail.

However, unlike FIGS. 1a to 1c and FIGS. 2a to 2c, the package includes a dam structure with first and second die dams. As shown, both die dams 1601 and 1602 are disposed on the non-sensor region of the active die surface with the die adhesive region 140 therebetween. For example, the first die dam 1601 surrounds the die adhesive region with the cover adhesive and the second die dam 1602 surrounds the sensor region 137. As a result, the cover adhesive 143 disposed on the die adhesive region is sandwiched between the first and second die dams. This blocks the bi-directional lateral flow of the cover adhesive during bleeding, and therefore prevents contamination on undesired areas, such as on the sensor region of the die and/or on the edges of the die or protective cover.

As shown, both first and second die dams have a rectangular-shaped cross-sectional profile, except the second die dam includes 4 slanted corners. Providing die dams with the same or different shapes may also be possible. Other configurations or shapes for the die dams may also be useful.

Figure 4A:
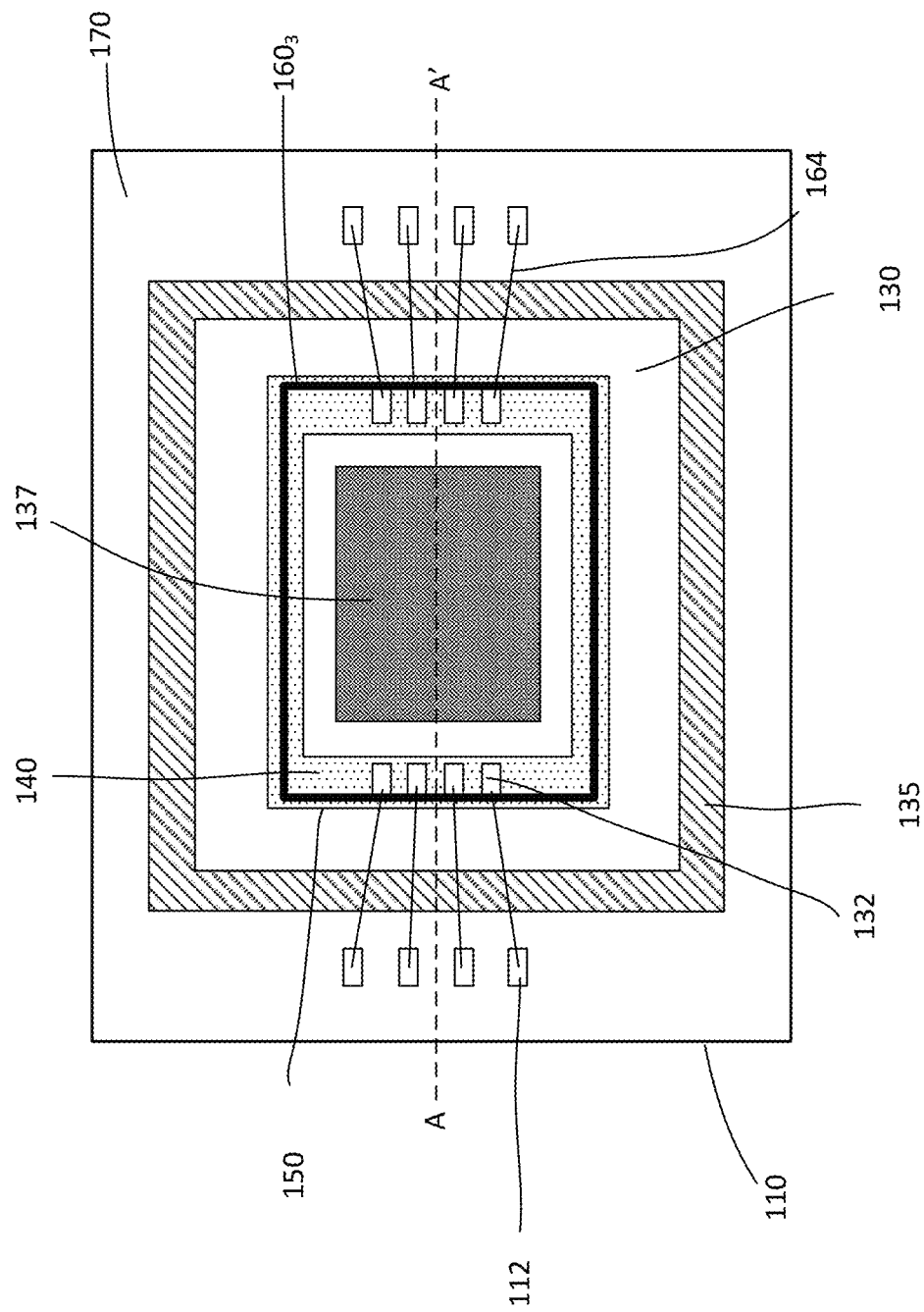
FIGS. 4a to 4c show top and side cross-sectional views of various embodiments of another semiconductor package.
Figure 4B:
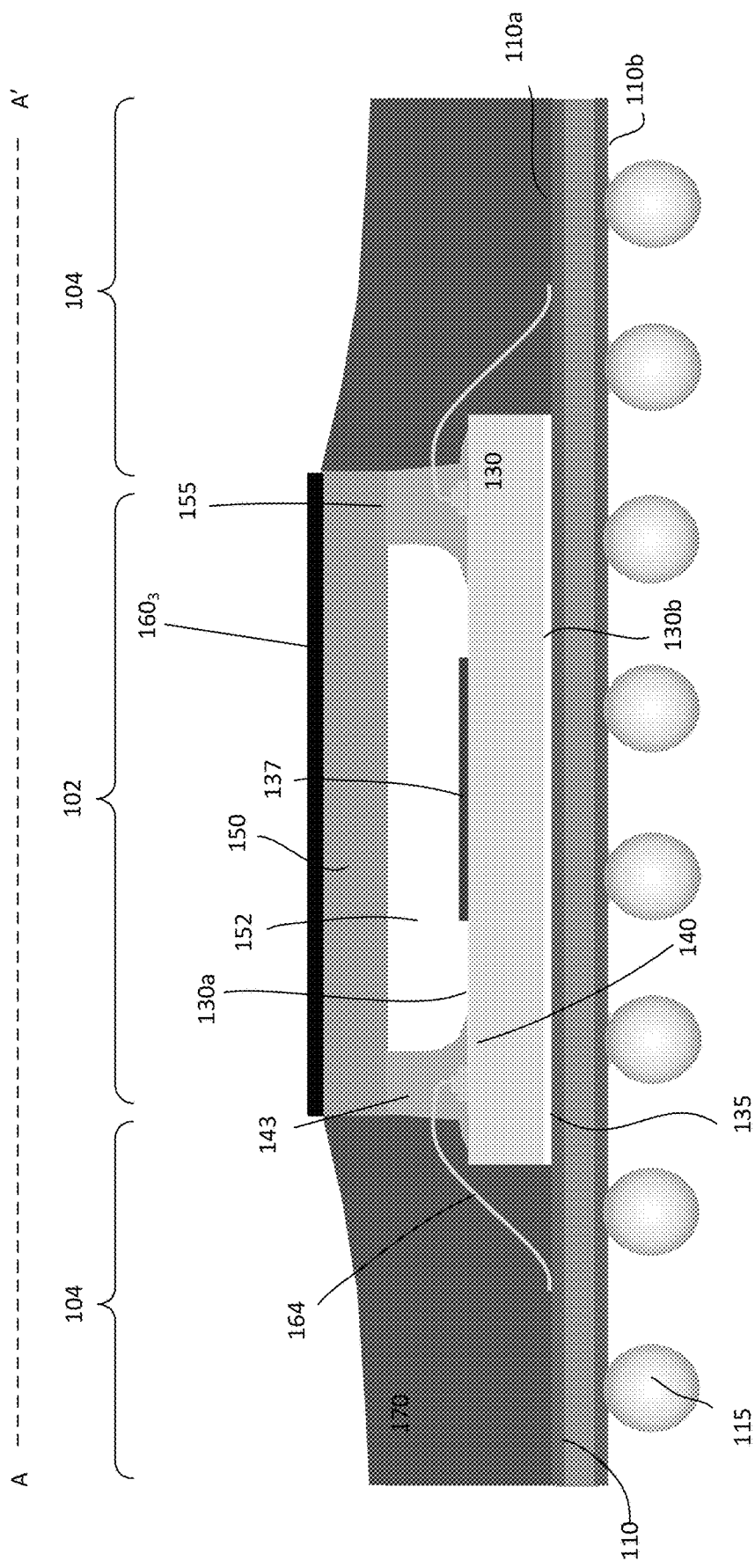
Figure 4C:
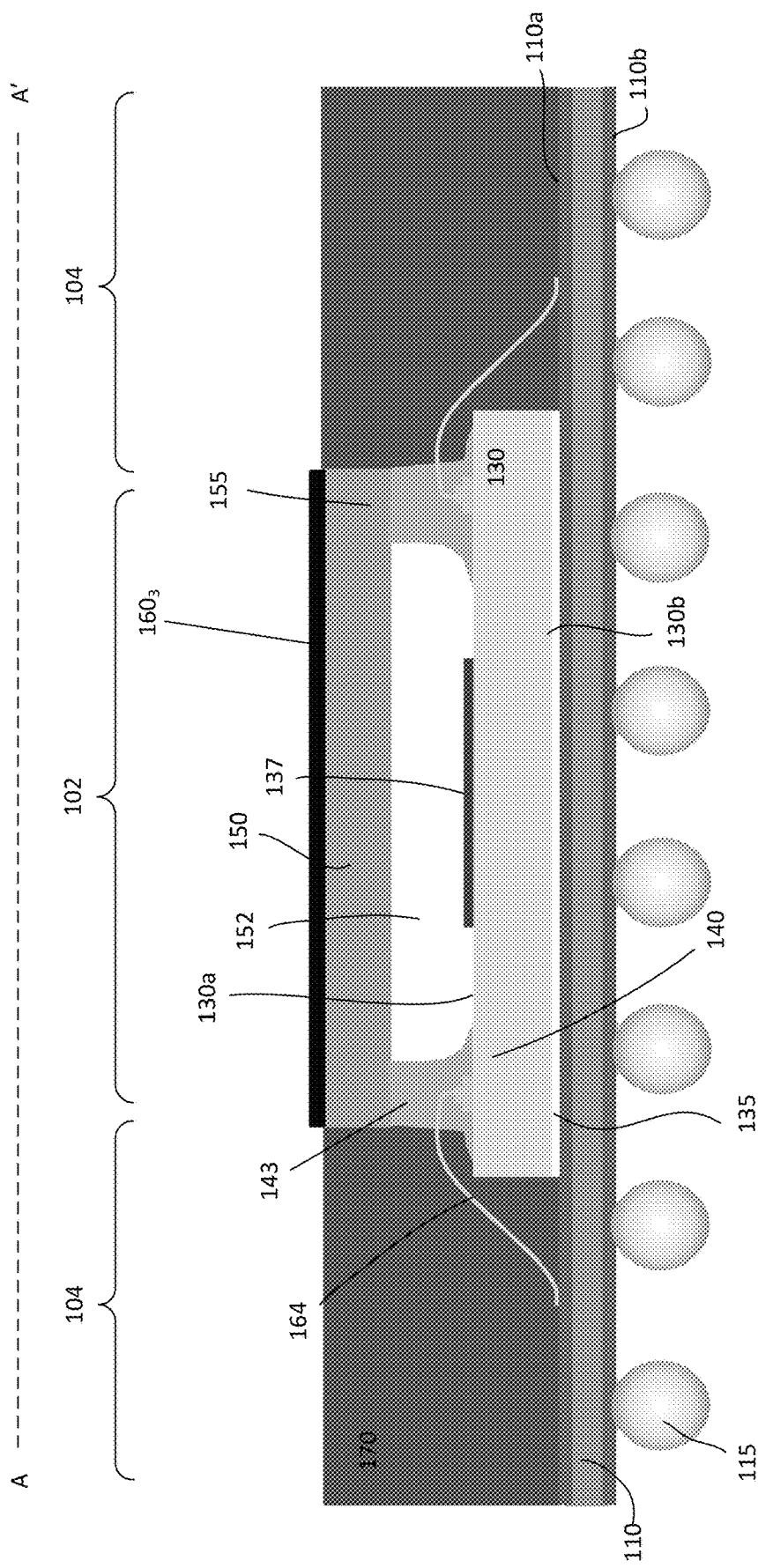

FIGS. 4a to 4c show top and side cross-sectional views of various embodiments of a semiconductor package 400. In particular, FIG. 4a shows a top cross-sectional view of a semiconductor package 400 with the package cover, and FIGS. 4b to 4c show side cross-sectional views taken along the A-A of the semiconductor package 400 formed with different encapsulants. The semiconductor package is similar to those described in FIGS. 1a to 1c. Common elements may not be described or described in detail.

However, unlike FIGS. 1a to 1c, the dam structure is not disposed on the active die surface. Instead, the dam structure is disposed on the top cover surface of the protective cover. The dam structure, in one embodiment, includes a cover dam. As shown, the cover dam 1603 is disposed around a periphery of the top cover surface of the protective cover 150. For example, a central region of the top cover surface is not covered and remains exposed to allow for light transmission from the protective cover to the sensor region on the active die surface.

In one embodiment, the cover dam is a rectangular ring-shaped structure. Other ring-shaped structures may also be useful. The cover dam has a height which prevents the encapsulant from bleeding beyond the cover dam. The height of the cover dam may be less than 100 microns such as about 40 to 60 microns. Other heights which prevent bleeding of the encapsulant therethrough may also be useful. For example, the cover dam prevents the encapsulant from bleeding beyond the cover dam and overflowing onto the top cover surface during the encapsulation process. The cover dam includes side surfaces with a height which prevents the encapsulant from bleeding beyond the cover dam, such as about less than 100 microns. As shown, the encapsulant 170 adheres to the sides of the protective cover while leaving the top of the protective cover and the cover dam exposed. This improves the reliability of the package.

Figure 5A:
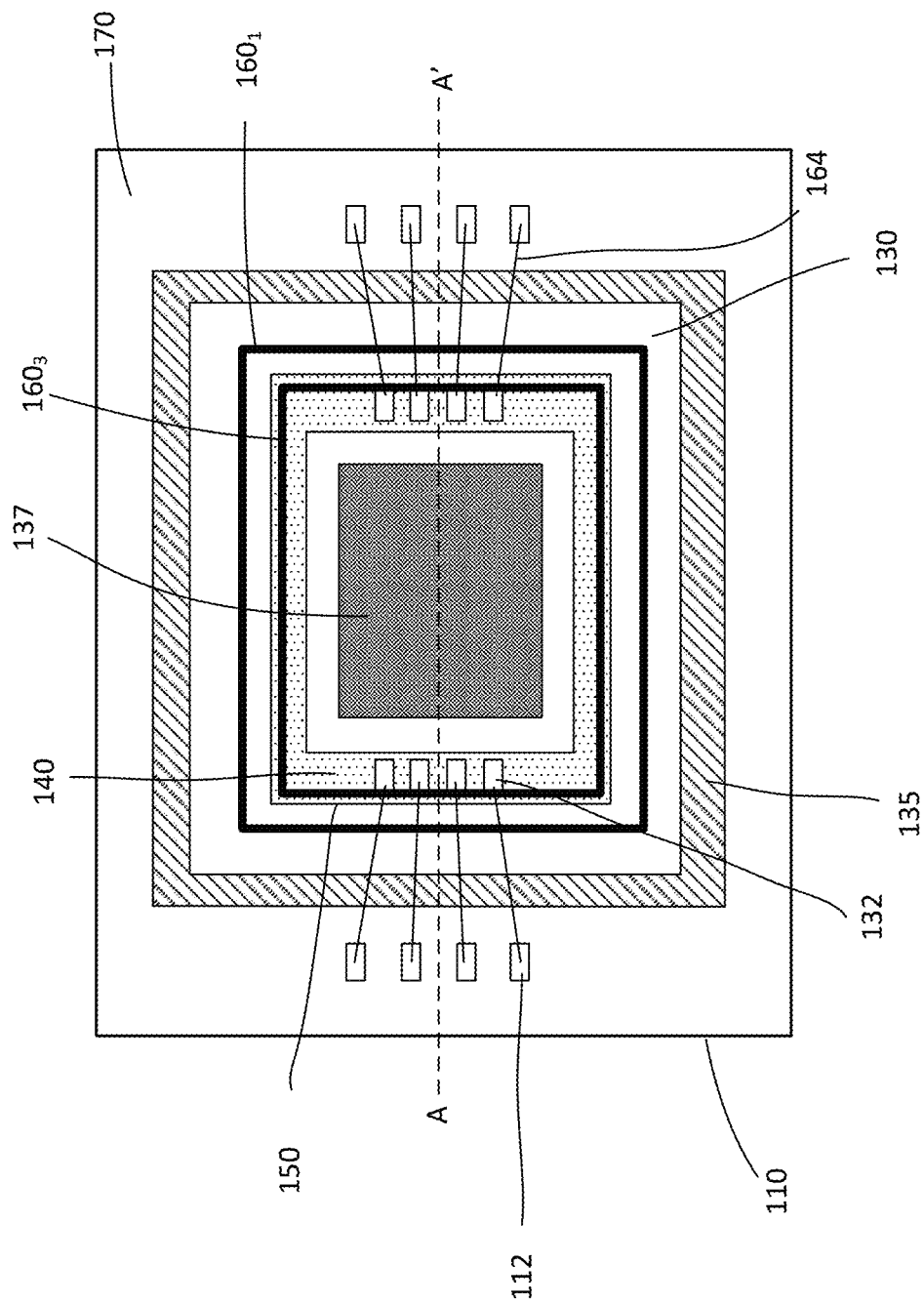
FIGS. 5a to 5c show top and side cross-sectional views of various embodiments of another semiconductor package.
Figure 5B:
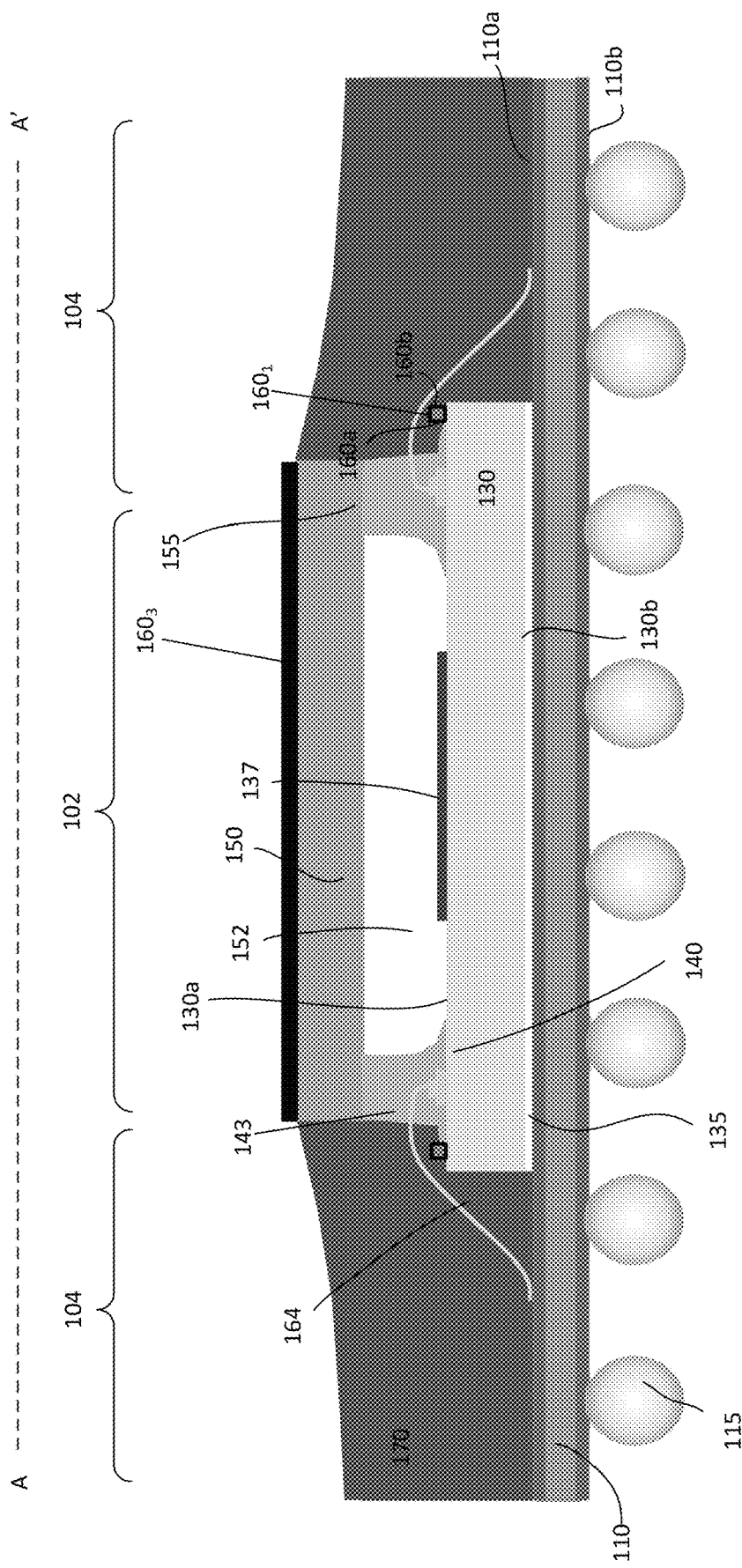
Figure 5C:
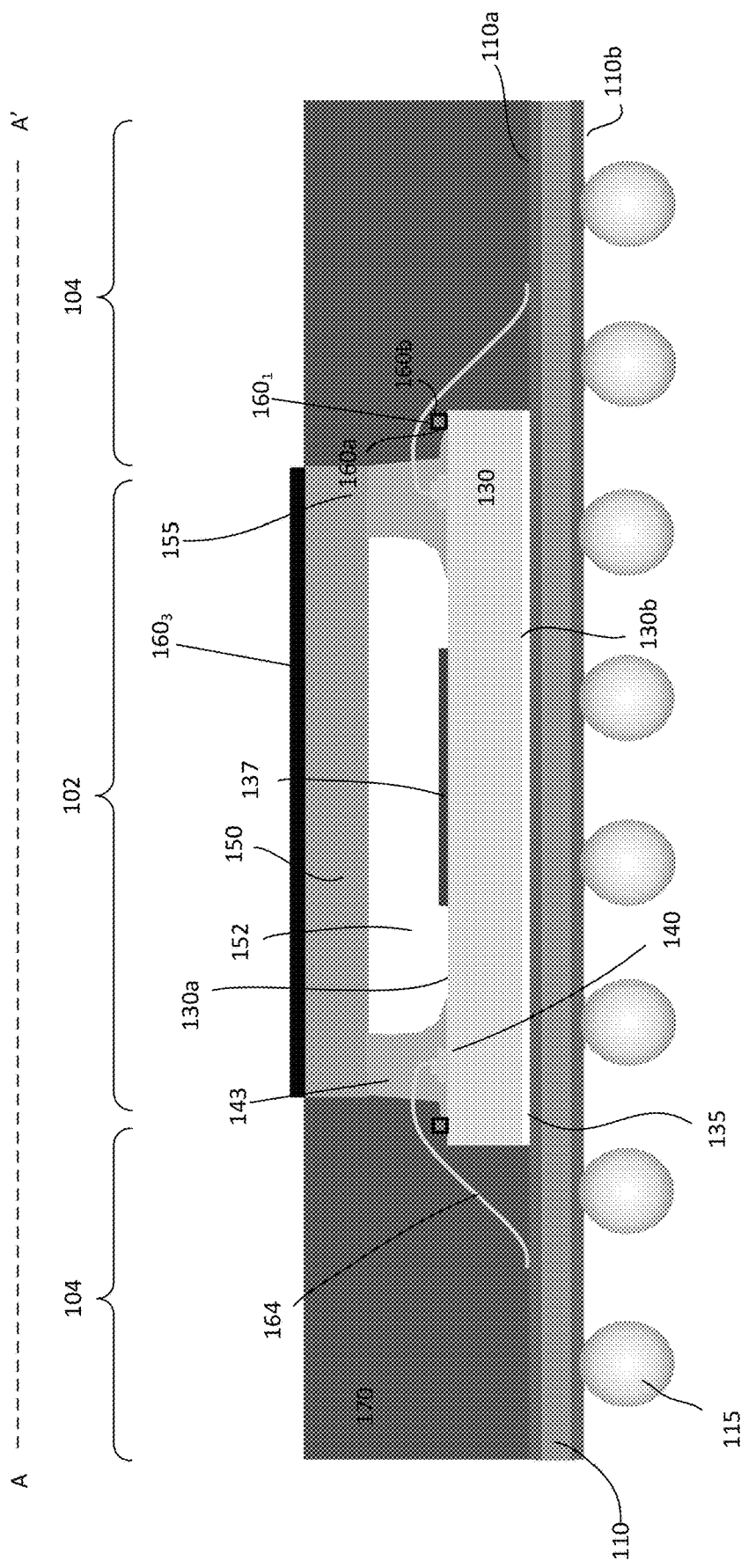

FIGS. 5a to 5c show top and side cross-sectional views of various embodiments of a semiconductor package 500. In particular, FIG. 5a shows a top cross-sectional view of a semiconductor package 500 with the package cover, and FIGS. 5b to 5c show side cross-sectional views taken along the A-A of the semiconductor package 500 formed with different encapsulants. The semiconductor package is similar to those described in FIGS. 1a to 1c and FIGS. 4a to 4c. Common elements may not be described or described in detail.

However, unlike FIGS. 1a to 1c and FIGS. 4a to 4c, the package includes a dam structure with a die dam and a cover dam. The die dam 1601, for example, is disposed on the active die surface while the cover dam 1603 is disposed on a top cover surface of the protective cover. Providing other numbers and/or combinations of the dams may also be possible. For example, the package may include multiple die dams disposed on different locations on the top package surface.

In one embodiment, the die dam 1601 is disposed between the die adhesive region 140 and the edges of the die. For example, the die dam surrounds the non-sensor region between the die adhesive region and edges of the die. As shown, the die dam completely surrounds the die adhesive region with the internal side surface 160a facing the die adhesive region and the sensor region. The die dam, in this case, prevents the cover adhesive from bleeding beyond the die dam towards the edges of the die and encapsulant from bleeding beyond the die dam towards the die bond pads and the sensor region. As for the cover dam 1603, it is disposed around a periphery of the top cover surface of the protective cover 150. For example, a central region of the top cover surface is not covered and remains exposed to allow for light transmission from the protective cover to the sensor region on the active die surface. The cover dam prevents the encapsulant 170 from bleeding beyond the cover dam and overflowing onto the top cover surface of the protective cover. Other configurations for the die and/or cover dams may also be possible.

Figure 6A:
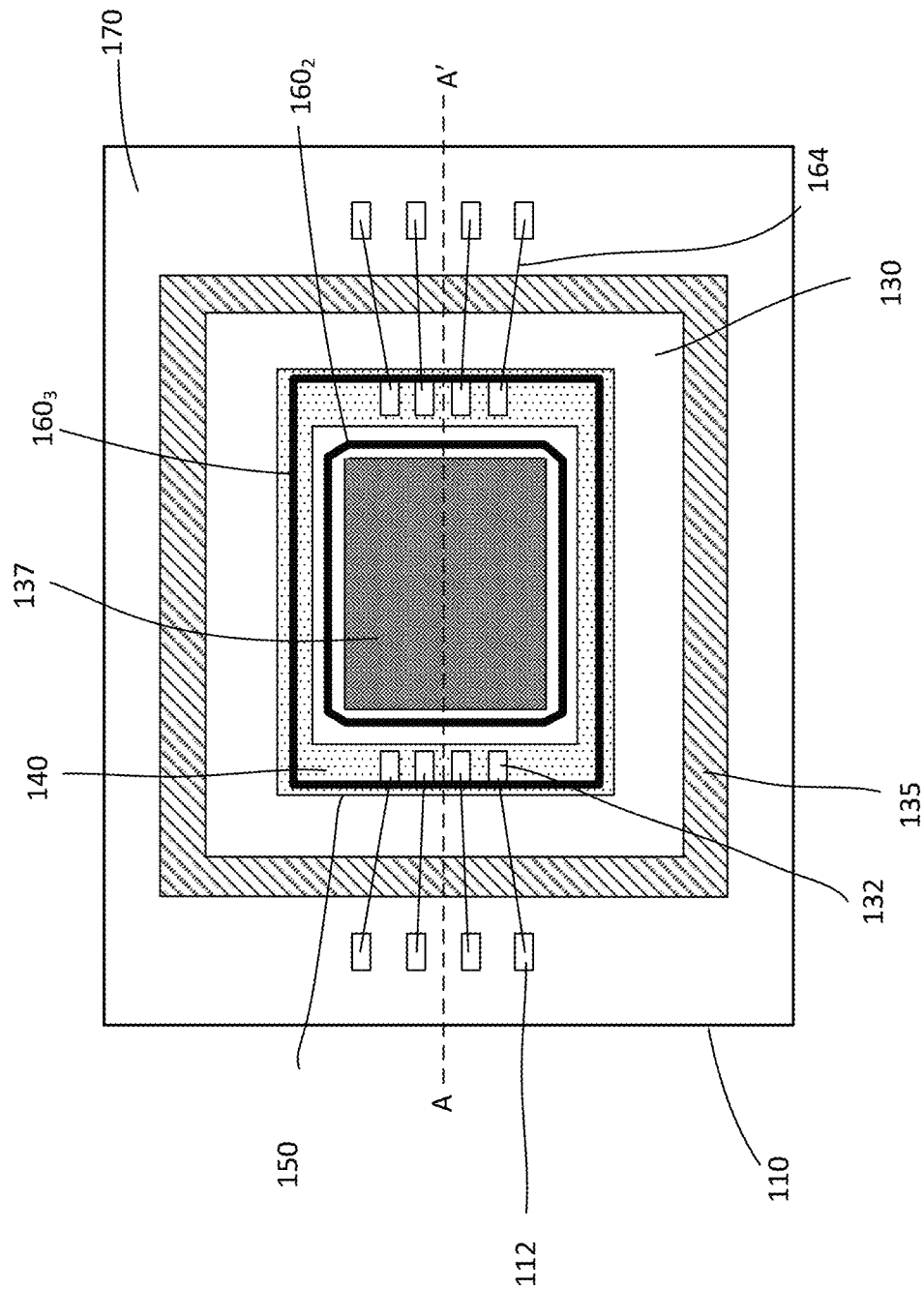
FIGS. 6a to 6c show top and side cross-sectional views of various embodiments of another semiconductor package.
Figure 6B:
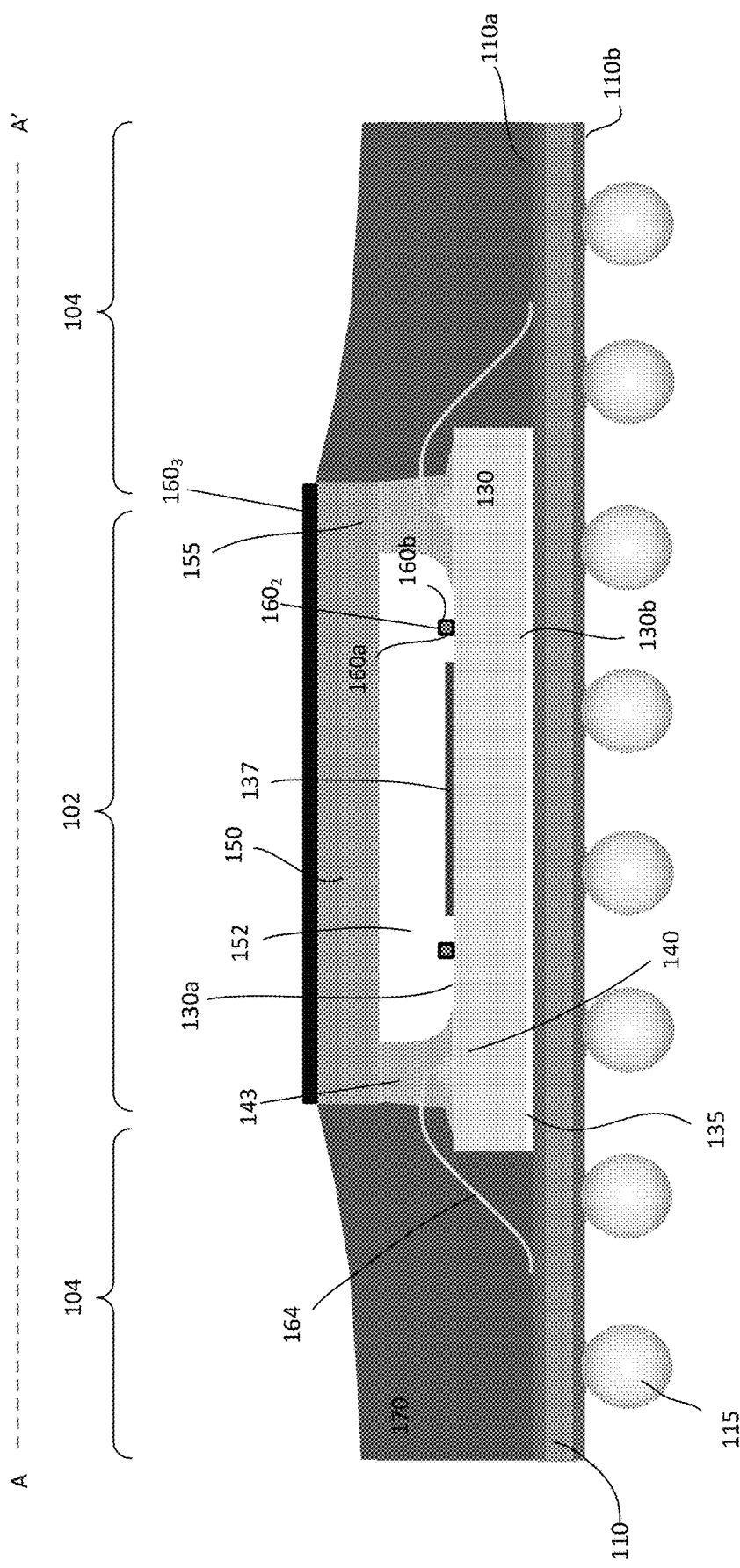
Figure 6C:
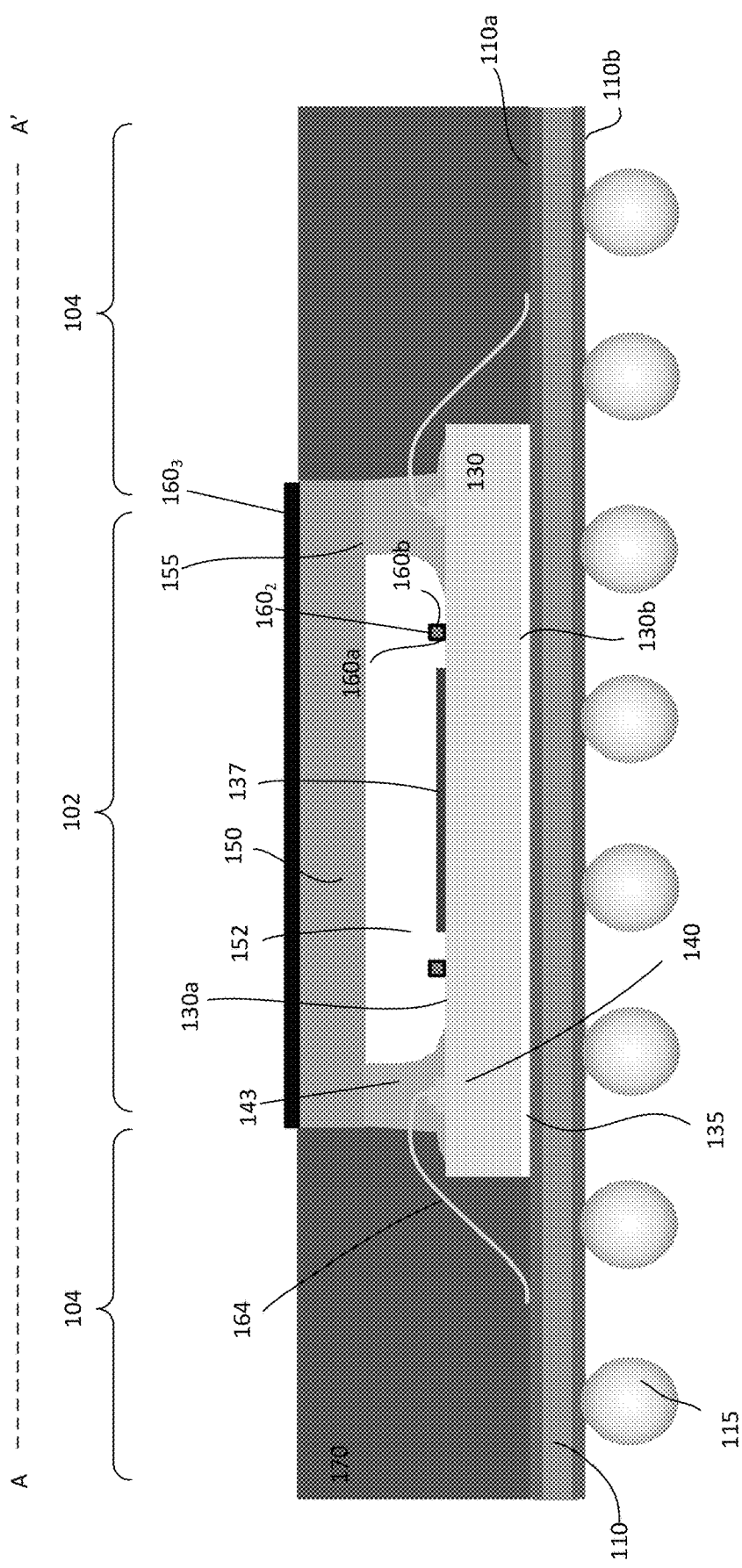

FIGS. 6a to 6c show top and side cross-sectional views of various embodiments of a semiconductor package 600. In particular, FIG. 6a shows a top cross-sectional view of a semiconductor package 600 with the package cover, and FIGS. 6b to 6c show side cross-sectional views taken along the A-A of the semiconductor package 600 formed with different encapsulants. The semiconductor package is similar to those described in FIGS. 5a to 5c. Common elements may not be described or described in detail.

As shown, the package includes a dam structure with a die dam 1602 and a cover dam 1603. Unlike FIGS. 5a to 5c, the die dam 1602 is disposed between the die adhesive region 140 and the sensor region 137. For example, the die adhesive region with the cover adhesive surrounds the die dam which surrounds the sensor region. As shown, the external side surface 160b of the die dam faces the die adhesive region while the internal side surface 160a faces the sensor region. Other configurations for the die and/or cover dams may also be possible. Providing other numbers and/or combinations of the dams may also be possible.

Figure 7A:
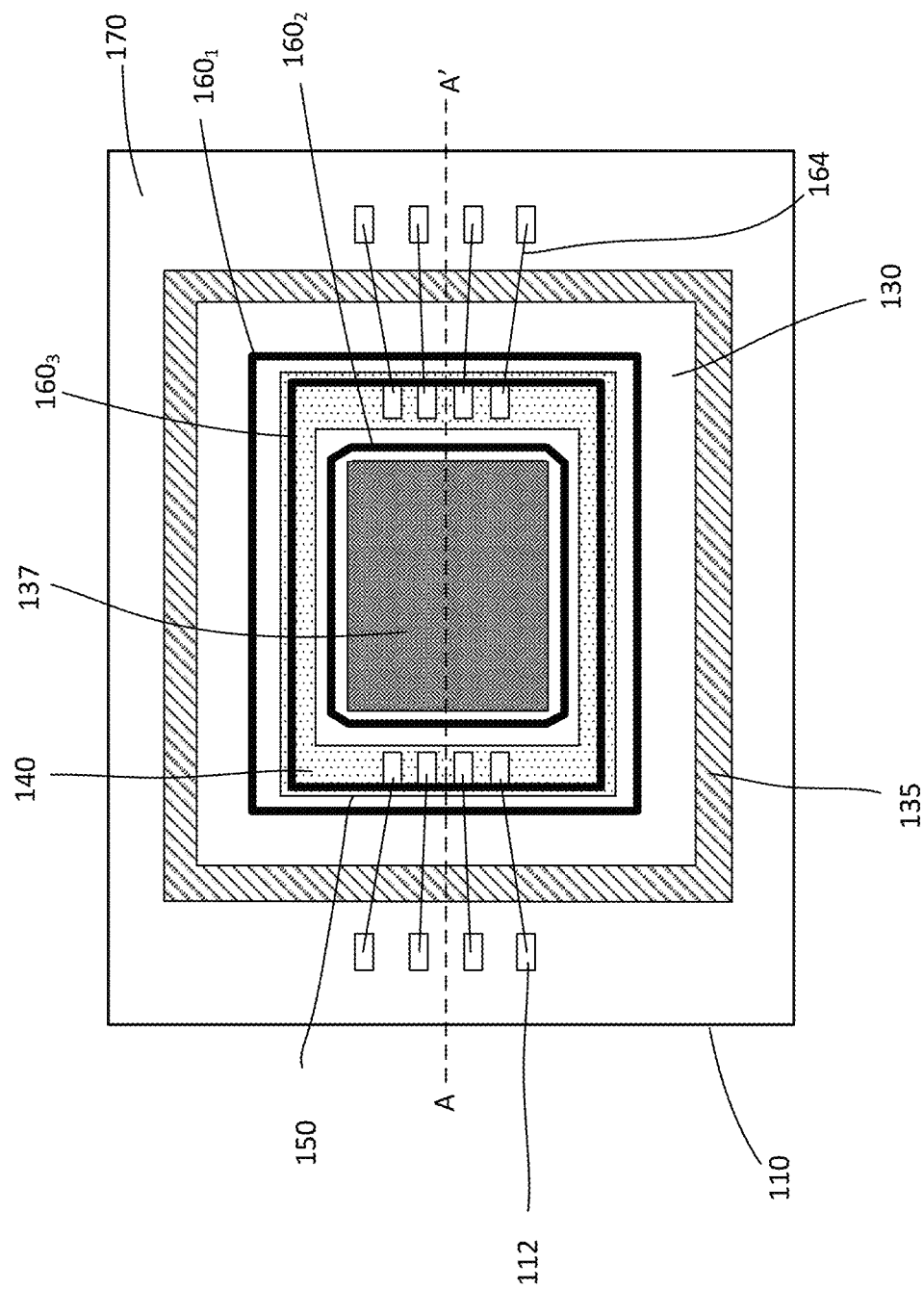
FIGS. 7a to 7c show top and side cross-sectional views of various embodiments of another semiconductor package.
Figure 7B:
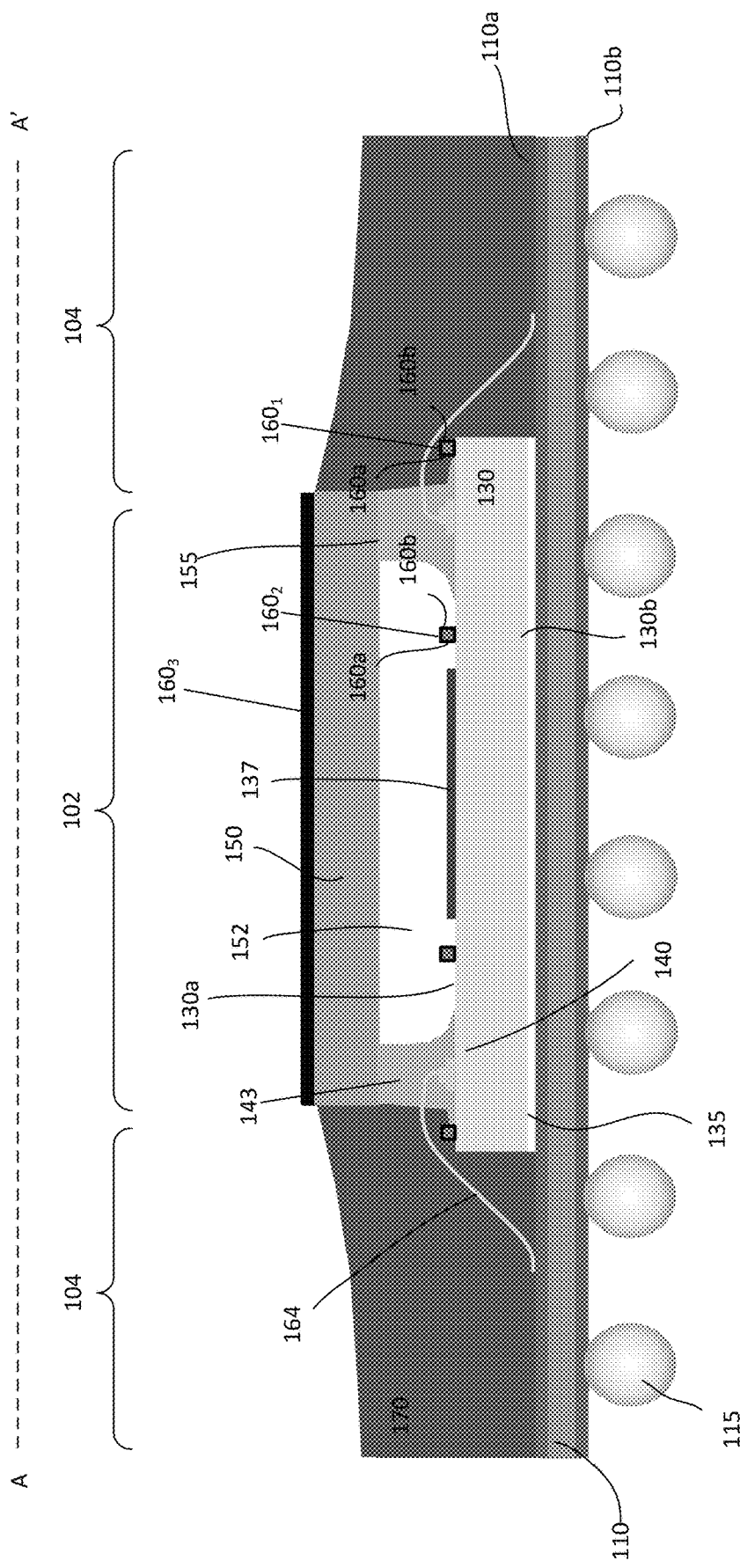
Figure 7C:
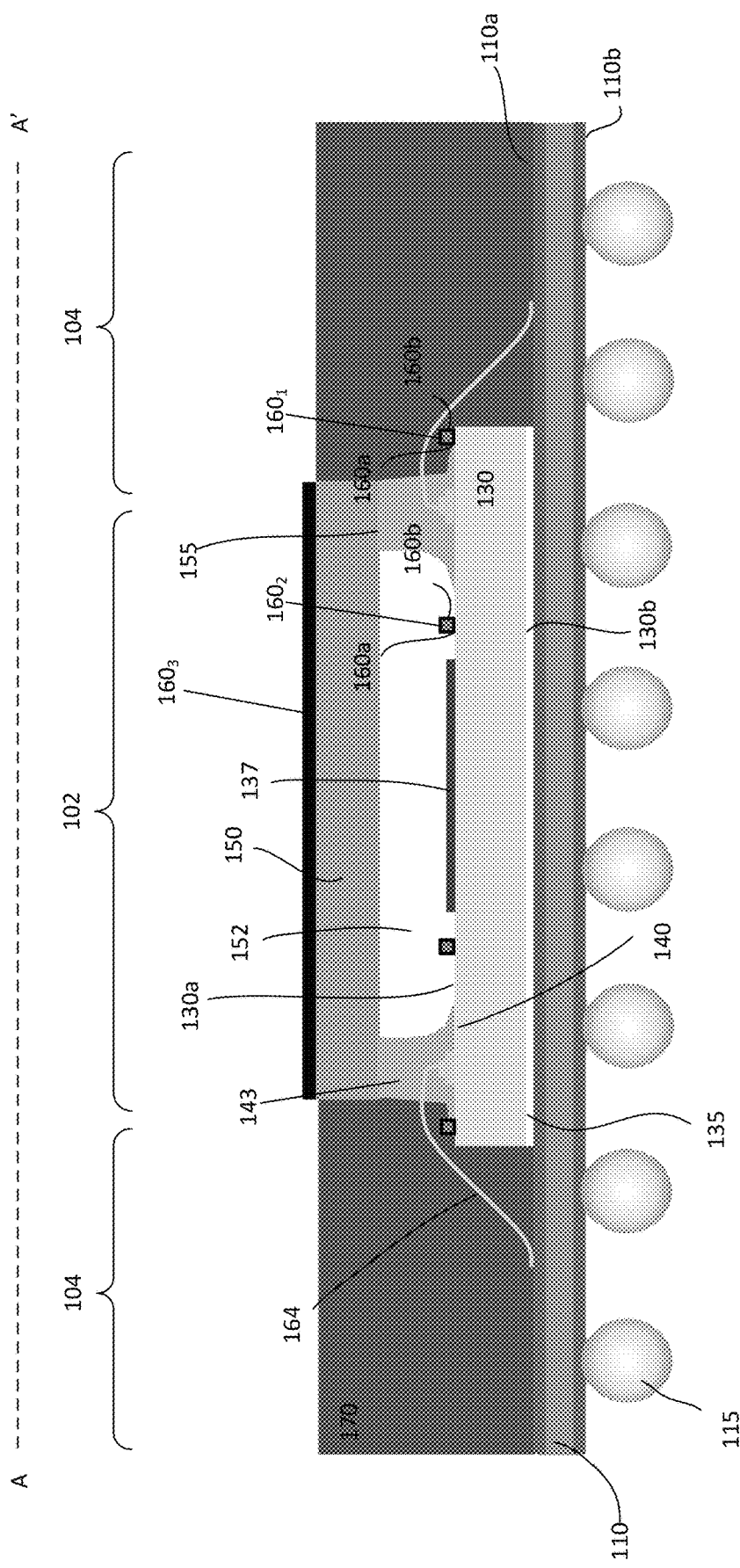

FIGS. 7a to 7c show top and side cross-sectional views of various embodiments of a semiconductor package 700. In particular, FIG. 7a shows a top cross-sectional view of a semiconductor package 700 with the package cover, and FIGS. 7b to 7c show side cross-sectional views taken along the A-A of the semiconductor package 700 formed with different encapsulants. The semiconductor package is similar to those described in FIGS. 5a to 5c and FIGS. 6a to 6c. Common elements may not be described or described in detail.

However, unlike FIGS. 5a to 5c and FIGS. 6a to 6c, the package includes a dam structure with 2 die dams disposed on the active die surface and 1 cover dam disposed on a top cover surface of the protective cover. Providing other numbers and/or combinations of the dams may also be possible.

In one embodiment, the die dams include first and second die dams disposed on the active die surface. Both die dams 1601 and 1602 are disposed on the non-sensor region of the active die surface with the die adhesive region 140 therebetween. As shown, the first die dam 1601 surrounds the die adhesive region 140 with the cover adhesive 143 and the second die dam 1602 surrounds the sensor region 137. As a result, the cover adhesive disposed on the die adhesive region is sandwiched between the first and second die dams. This blocks the bi-directional lateral flow of the cover adhesive during bleeding, and therefore prevents contamination on undesired areas, such as on the sensor region of the die and/or on the edges of the die or protective cover.

As for the cover dam 1603, it is disposed around a periphery of the top cover surface of the protective cover 150. For example, a central region of the top cover surface is not covered and remains exposed to allow for light transmission from the protective cover to the sensor region on the active die surface. The cover dam prevents the encapsulant 170 from bleeding beyond the cover dam and overflowing onto the top cover surface of the protective cover. Other configurations for the die and/or cover dams may also be possible.

FIG. 8 shows an exemplary process 800 of forming an embodiment of a semiconductor package. The package, for example, is similar to those described in FIGS. 1a to 1c, FIGS. 2a to 2c, and FIGS. 3a to 3c. Common elements may not be described or described in detail.

The process flow 800, for example, commences at 810. For example, at 810, a package substrate is provided. The package substrate may include top and bottom package surfaces. The top package surface of the package substrate may include a die attach region and package bond pads disposed outside of the die attach region.

A die is attached to the die attach region, for example, by a die adhesive. The die adhesive may be an adhesive tape disposed on the die attach region. The die, for example, is temporarily attached to the die attach region. For example, a curing process may be performed to permanently attach the die to the die region. The bottom surface or inactive surface of the die, for example, contacts the die attach region. In one embodiment, the active die surface includes a sensor region. Depending on the application of the die, the sensor region may include a sensor or an array of sensors. The top or active die surface may include die bond pads disposed outside of the sensor region. For example, the die bond pads may be disposed on the non-sensor region of the active surface of the die.

Wire bonds are formed at 820. The wire bonds may be formed on die bond pads disposed within a die adhesive region surrounding the sensor region. Providing other arrangements for the die bond pads and the wire bonds may also be possible. For example, wire bonds may be formed on die bond pads disposed within the die adhesive region or a combination of die adhesive region and outside of the die adhesive region.

At 830, a dam structure is formed on the non-sensor region of the active die surface. The dam structure, in one embodiment, includes a die dam. The die dam, for example, is an elevated ring-shaped structure configured to prevent the cover adhesive and/or encapsulant from bleeding beyond the die dam. In one embodiment, depending on its application, the die dam may be formed on different locations of the active die surface outside of the sensor region. For example, to protect the sensor region on the active die surface, the die dam may be formed adjacent to and surrounding the sensor region. The die adhesive region, for example, surrounds the die dam surrounding the sensor region. Alternatively, the die dam, for example, may be formed between the die adhesive region and the edges of the die. In such cases, the die dam prevents the cover adhesive from bleeding beyond the die dam towards the edges of the die and encapsulant from bleeding beyond the die dam towards the die bond pads and the sensor region. Other configurations for forming the die dam may also be possible.

In some embodiments, the dam structure may include multiple die dams. The die dams may be disposed on different locations on the active die surface. The dam structure, in one embodiment, includes 2 die dams disposed on the non-sensor region of the active die surface with the die adhesive region 140 therebetween. The die dams, in this case, serve to block the bi-directional lateral flow of the cover adhesive during bleeding. This prevents contamination on undesired areas, such as on the sensor region of the die and/or on the edges of the die or protective cover. Providing a dam structure with different numbers or other arrangements of the die dams may also be useful.

The die dam or dams are, for example, adhesive-based dams. The adhesive may be a non-conductive adhesive material that is curable. Such adhesive materials may include epoxy or any other suitable adhesive materials. In the case of a liquid-based adhesive, a printing process may be performed to form the dam structure with the die dam or dams on the active die surface. For example, printing techniques such as stencil printing, or printing by ink jet or ink dot may be used to deposit the liquid-based adhesive on the active die surface. A curing process is performed thereafter. Alternatively, an adhesive tape or film can be applied on the active die surface to form the dam structure.

A protective cover is attached to the die at 840. The protective cover, for example, is a glass cover. Other types of protective cover may also be useful. A cover adhesive is applied on the die adhesive region for attaching the protective cover to the die. The cover adhesive may be a UV curable adhesive. Other types of adhesives may also be useful. The cover adhesive may be applied by dispensing. Other techniques for applying the cover adhesive may also be useful. In some embodiments, the die bond pads are disposed within the die adhesive region. In such cases, the cover adhesive is disposed on the die bond pads and portions of the wire bonds thereover.

When the protective cover is placed on the cover adhesive, the dam structure with the die dam or dams prevents the cover adhesive from bleeding beyond the die dams and towards undesired areas, such as onto the sensor region of the die and/or onto the edge of the die or protective cover. A curing process such as UV curing or thermal curing may be performed thereafter to permanently attach the protective cover to the die.

At 850, an encapsulant, such as epoxy, is formed over the package substrate. The encapsulant covers the package substrate, exposed portions of the die and wire bonds, and sides of the protective cover. The epoxy may be formed by, for example, dispensing. Other techniques or materials may also be employed for the encapsulant. The encapsulant is cured thereafter.

It is appreciated that the above process can be used for forming different types of packages. In some embodiments, the package can be a lead frame package. In other embodiments, the package may be a BGA type package. In such cases, a process to form the package contacts may be performed after encapsulation at 850. For example, the package contacts are formed on the bottom package surface of the package substrate. The package contacts are coupled to the package bond pads on the top package surface by, for example, one or more metal layers and via contacts embedded in the package substrate. The package contacts, for example, may include spherical-shaped structures or balls arranged in grid pattern to form a BGA type package. A conductive material may be used to form the package contacts. The package contacts, for example, can be formed from solder. Various types of solder can be used to form the package contacts. For example, the solder can be a lead-based or non lead-based solder. Forming other configurations or types of packages may also be possible.

Figure 9:
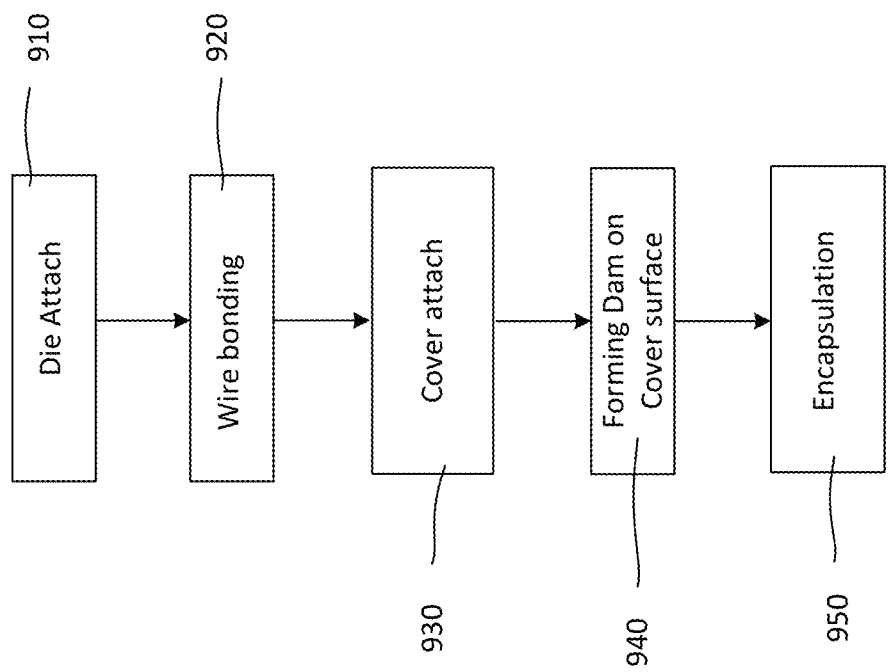
FIG. 9 shows an exemplary process of forming another embodiment of a semiconductor package.

FIG. 9 shows an exemplary process 900 of forming an embodiment of a semiconductor package. The package, for example, is similar to those described in FIGS. 4a to 4c. Common elements may not be described or described in detail.

Referring to process 900, it is similar to process 800, except no die dams are formed. For example, after forming wire bonds at 920, the process proceeds to attach a protective cover to the die using a cover adhesive at 930. Common elements may not be described or described in detail.

After the protective cover is attached, a dam structure is formed at 940. The dam structure, in one embodiment, includes a cover dam formed on a top cover surface of the protective cover. The cover dam prevents, for example, encapsulant from bleeding beyond the cover dam and overflowing onto the top cover surface during the encapsulation process. In one embodiment, the cover dam surrounds a periphery of the top cover surface while leaving a central region of the top cover surface exposed for light transmission to the sensor region on the active die surface.

The cover dam may be an adhesive-based dam formed using, for example, a printing process. Alternatively, other techniques such as dispensing or applying an adhesive tape or film on the top cover surface to form the cover dam may also be possible.

At 950, an encapsulant, such as epoxy, is formed over the package substrate. The encapsulant covers the package substrate, exposed portions of the die and wire bonds, and sides of the protective cover. As discussed, the top cover of the protective cover and the cover dam remained exposed. The epoxy may be formed by, for example, dispensing. Other techniques or materials may also be employed for the encapsulant. The encapsulant is cured thereafter.

It is appreciated that the above process can be used for forming different types of packages. In some embodiments, the package can be a lead frame package. In other embodiments, the package may be a BGA type package. In such cases, a process to form the package contacts may be performed after encapsulation at 950. For example, the package contacts are formed on the bottom package surface of the package substrate. The package contacts are coupled to the package bond pads on the top package surface by, for example, one or more metal layers and via contacts embedded in the package substrate. The package contacts, for example, may include spherical-shaped structures or balls arranged in grid pattern to form a BGA type package. A conductive material may be used to form the package contacts. The package contacts, for example, can be formed from solder. Various types of solder can be used to form the package contacts. For example, the solder can be a lead-based or non lead-based solder. Forming other configurations or types of packages may also be possible.

FIG. 10 shows an exemplary process 1000 of forming an embodiment of a semiconductor package. The package, for example, is similar to those described in FIGS. 5a to 5c, FIGS. 6a to 6c, and FIGS. 7a to 7c. Common elements may not be described or described in detail.

Referring to process 1000, it is similar to process 800 in FIG. 8. For example, process steps 1010 to 1040 are similar to process steps 810 to 840 of process 800. Common elements may not be described or described in detail. However, unlike process 800, process 1000 continues to form a cover dam as part of the dam structure after cover attachment. For example, the dam structure on the package substrate includes a combination of die dam or dams and a cover dam. As shown, the die dam or dams are formed at 1030, prior to cover attachment at 1040. Further, as discussed, the die dam or dams may be formed to surround the die adhesive region or only the sensor region, or a combination thereof. Other configurations for the die dams may also be possible.

As for the cover dam, it is formed on the top cover surface of the attached protective cover at 1050. The cover dam prevents the encapsulant from bleeding beyond the cover dam and overflowing onto the top cover surface during the encapsulation process. In one embodiment, the cover dam surrounds a periphery of the top cover surface while leaving a central region of the top cover surface exposed for light transmission to the sensor region on the active die surface. Like the die dam, the cover dam may be an adhesive-based dam formed using a printing process. Alternatively, other techniques such as dispensing or applying an adhesive tape or film on the top cover surface to form the cover dam may also be possible.

At 1060, an encapsulant, such as epoxy, is formed over the package substrate. The encapsulant covers the package substrate, exposed portions of the die and wire bonds, and sides of the protective cover. The top cover of the protective cover and the cover dam remained exposed. The epoxy may be formed by, for example, dispensing. Other techniques or materials may also be employed for the encapsulant. The encapsulant is cured thereafter.

It is appreciated that the above process can be used for forming different types of packages. In some embodiments, the package can be a lead frame package. In other embodiments, the package may be a BGA type package. In such cases, a process to form the package contacts may be performed after encapsulation in 1060. For example, the package contacts are formed on the bottom package surface of the package substrate. The package contacts are coupled to the package bond pads on the top package surface by, for example, one or more metal layers and via contacts embedded in the package substrate. The package contacts, for example, may include spherical-shaped structures or balls arranged in grid pattern to form a BGA type package. A conductive material may be used to form the package contacts. The package contacts, for example, can be formed from solder. Various types of solder can be used to form the package contacts. For example, the solder can be a lead-based or non lead-based solder. Forming other configurations or types of packages may also be possible.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a package substrate having top and bottom major package substrate surfaces, the top major package surface includes a die attach region;
   a die having a second major die surface attached to the die attach region, wherein a first major die surface of the die includes a sensor region and a die adhesive region surrounding the sensor region;
   a cover adhesive disposed on the die adhesive region, wherein the cover adhesive comprises an adhesive height;
   a protective cover attached to the die by the cover adhesive, the protective cover forms a cavity over the sensor region, wherein the adhesive height defines a cavity height of the cavity; and
   a cavity dam structure, the dam structure is disposed on the first major die surface between an inner periphery of the die adhesive region and the sensor region, the cavity dam structure surrounds the sensor region to prevent the cover adhesive from bleeding beyond the dam structure into the sensor region.

2. The device of claim 1 wherein the cavity dam structure comprises a cavity dam height which is less than the cavity height.

3. The device of claim 2 wherein the cavity dam height is less than 100 microns.

4. The device of claim 1 comprises an encapsulant encapsulating the device, the encapsulant leaves the protective cover exposed.

5. The device of claim 4 comprises an outer cavity dam structure, wherein the outer cavity dam structure is disposed on the first major die surface of the die between an outer periphery of the die adhesive region and die edges, the outer cavity dam structure surrounds the die adhesive region.

6. The device of claim 5 wherein the outer cavity dam prevents the cover adhesive from bleeding to the edges of the die to improve adhesion of the encapsulant encapsulating the device.

7. The device of claim 5 wherein the outer cavity dam structure comprises an outer cavity dam height which is less than the cavity height.

8. The device of claim 7 wherein the outer cavity dam height is less than 100 microns.

9. The device of claim 5 comprises a cover dam structure disposed on a periphery of a top surface of the protective cover, the cover dam structure surrounds the periphery of the protective cover.

10. The device of claim 9 wherein the cover dam prevents the encapsulant from bleeding onto the top surface of the protective cover within the cover dam.

11. The device of claim 9 wherein a cover dam height of the cover dam is 40-60 microns.

12. The device of claim 1 wherein:
   the die comprises a plurality of die bond pads disposed within the die adhesive region; and
   further comprising wire bonds coupling the die bond pads to package pads on the top major package surface.

13. The device of claim 1 wherein the cavity dam structure comprises an adhesive-based cavity dam structure.

14. A device comprising:
   a package substrate having top and bottom major package substrate surfaces, the top major package surface includes a die attach region;
   a sensor die having a second major die surface attached to the die attach region, wherein a first major die surface of the die includes a sensor region and a die adhesive region surrounding the sensor region;
   a cover adhesive disposed on the die adhesive region, wherein the cover adhesive comprises an adhesive height;

a transparent protective cover attached to the die by the cover adhesive, the protective cover forms a cavity over the sensor region, wherein a cavity height of the cavity is defined by the adhesive height;

an encapsulant encapsulating the device while leaving a top cover surface of the transparent protective cover exposed; and a cover dam structure, the cover dam structure is disposed on a periphery of a top surface of the protective cover, the cover dam structure surrounds the periphery of the protective cover to prevent the encapsulant from bleeding beyond the cover dam structure to the top protective cover within the cover dam structure.

15. The device of claim 14 comprises an outer cavity dam structure, wherein the outer cavity dam structure is disposed on the first major surface of the sensor die between the die adhesive region and the die edges to prevent the cover adhesive bleeding beyond the outer cavity dam structure to improve adhesion of the encapsulant encapsulating the device.

16. The device of claim 15 comprises an inner cavity dam structure, wherein the inner cavity dam structure is disposed on the first major surface of the sensor die between the die adhesive region and the sensor region, the inner cavity dam structure surrounds the sensor region to prevent the cover adhesive from bleeding beyond the dam structure into the sensor region.

17. The device of claim 16 wherein a height of the inner and outer cavity dam structures is less than the cavity height.

18. The device of claim 14 comprises an inner cavity dam structure, wherein the inner cavity dam structure is disposed on the first major surface of the sensor die between the die adhesive region and the sensor region, the inner cavity dam structure surrounds the sensor region to prevent the cover adhesive from bleeding beyond the dam structure into the sensor region.

19. The device of claim 18 wherein a height of the inner cavity dam structure is less than the cavity height.

20. The device of claim 14 wherein:
the die comprises a plurality of die bond pads disposed within the die adhesive region; and
further comprising wire bonds coupling the die bond pads to package pads on the top major package surface.

* * * * *